United States Patent
Nagai

(10) Patent No.: US 7,610,542 B2
(45) Date of Patent: Oct. 27, 2009

(54) SEMICONDUCTOR MEMORY IN WHICH ERROR CORRECTION IS PERFORMED BY ON-CHIP ERROR CORRECTION CIRCUIT

(75) Inventor: Takeshi Nagai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 697 days.

(21) Appl. No.: 11/454,007

(22) Filed: Jun. 16, 2006

(65) Prior Publication Data

US 2007/0226590 A1 Sep. 27, 2007

(30) Foreign Application Priority Data

Mar. 9, 2006 (JP) ............... 2006-064428

(51) Int. Cl.
*G11C 29/00* (2006.01)
(52) U.S. Cl. ..................... 714/763; 714/774
(58) Field of Classification Search .......... 714/763, 714/774
See application file for complete search history.

(56) References Cited

U.S. PATENT DOCUMENTS 6,701,480 B1 * 3/2004 Karpuszka et al. .......... 714/764
7,275,200 B2 * 9/2007 Leung ..................... 714/763
7,328,365 B2 * 2/2008 Karpuszka et al. ............. 714/6
7,353,438 B2 * 4/2008 Leung et al. ............... 714/720
7,392,456 B2 * 6/2008 Leung et al. ............... 714/763
7,464,320 B2 * 12/2008 Nagai et al. ............... 714/763

FOREIGN PATENT DOCUMENTS

JP 4-349549 12/1992

OTHER PUBLICATIONS

Ken Gray, "Adding Error-Correcting Circuitry to ASIC Memory", IEEE Spectrum, Apr. 2000, pp. 55-60.

* cited by examiner

*Primary Examiner*—Stephen M Baker
(74) *Attorney, Agent, or Firm*—Oblon, Spivak, McClelland, Maier & Neustadt, L.L.P.

(57) ABSTRACT

A synchronous semiconductor memory which performs a pipeline operation includes an error correction circuit, an output circuit, and first and second write circuits. The first write circuit is configured to overwrite at least a portion of externally input write data on data read out from a memory cell and corrected by the error correction circuit, and write the overwritten data in the memory cell. The output circuit is configured to output the overwritten data outside a chip. The second write circuit is configured to reoverwrite at least a portion of write data which is externally input at a different time on the overwritten data, encode the reoverwritten data, and write the encoded data in the memory cell.

16 Claims, 25 Drawing Sheets

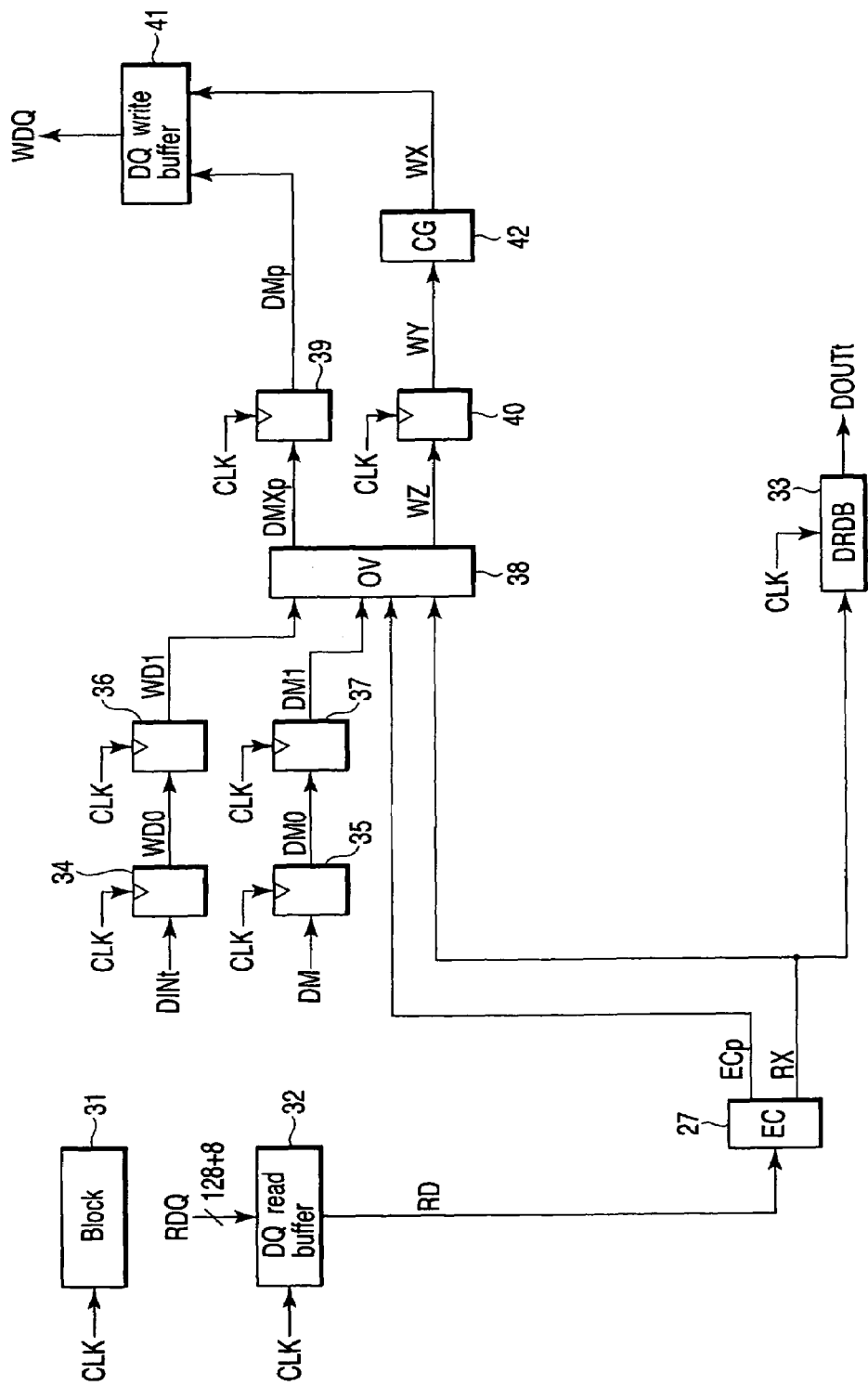
F I G. 6

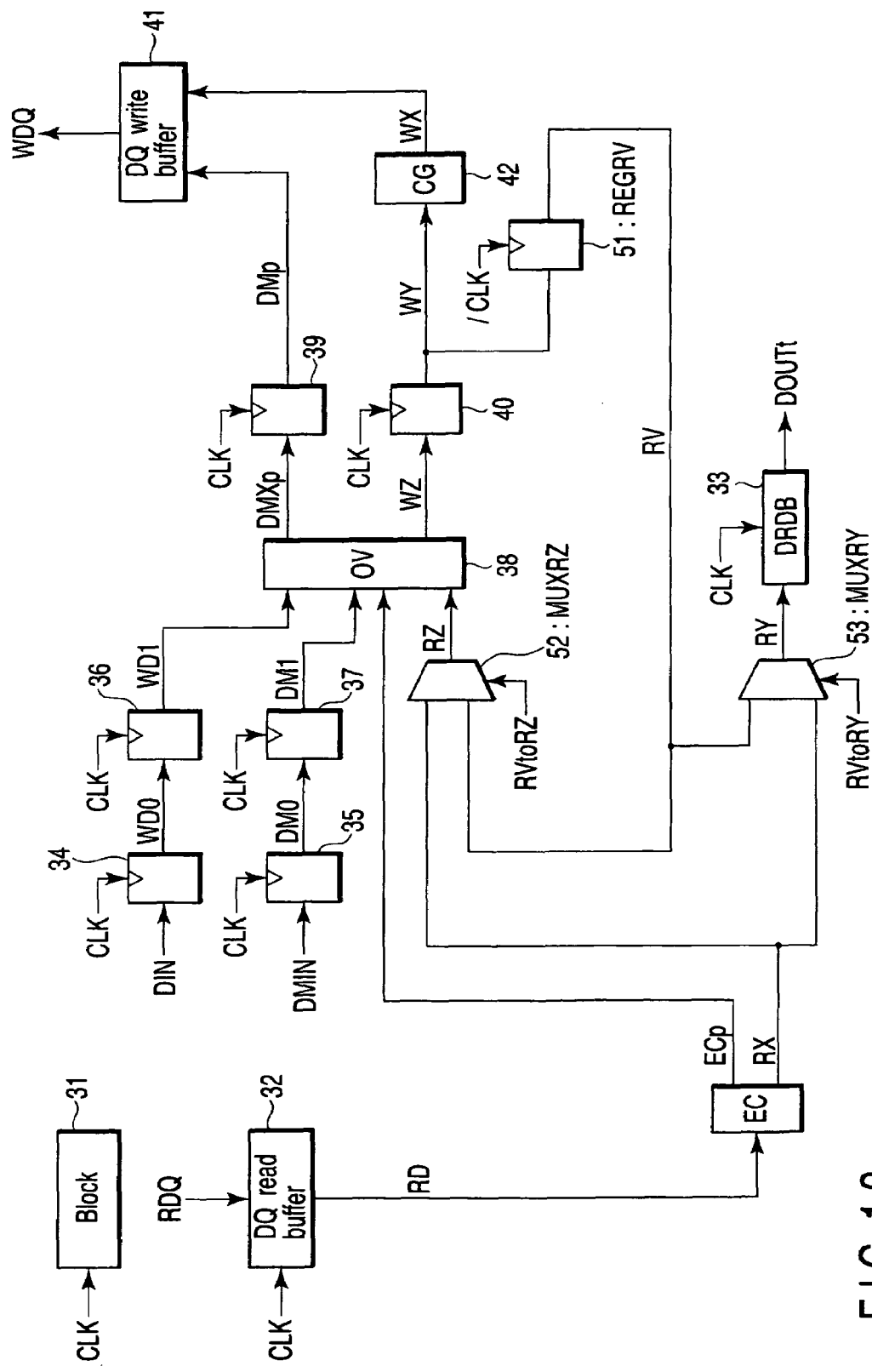
F I G. 12

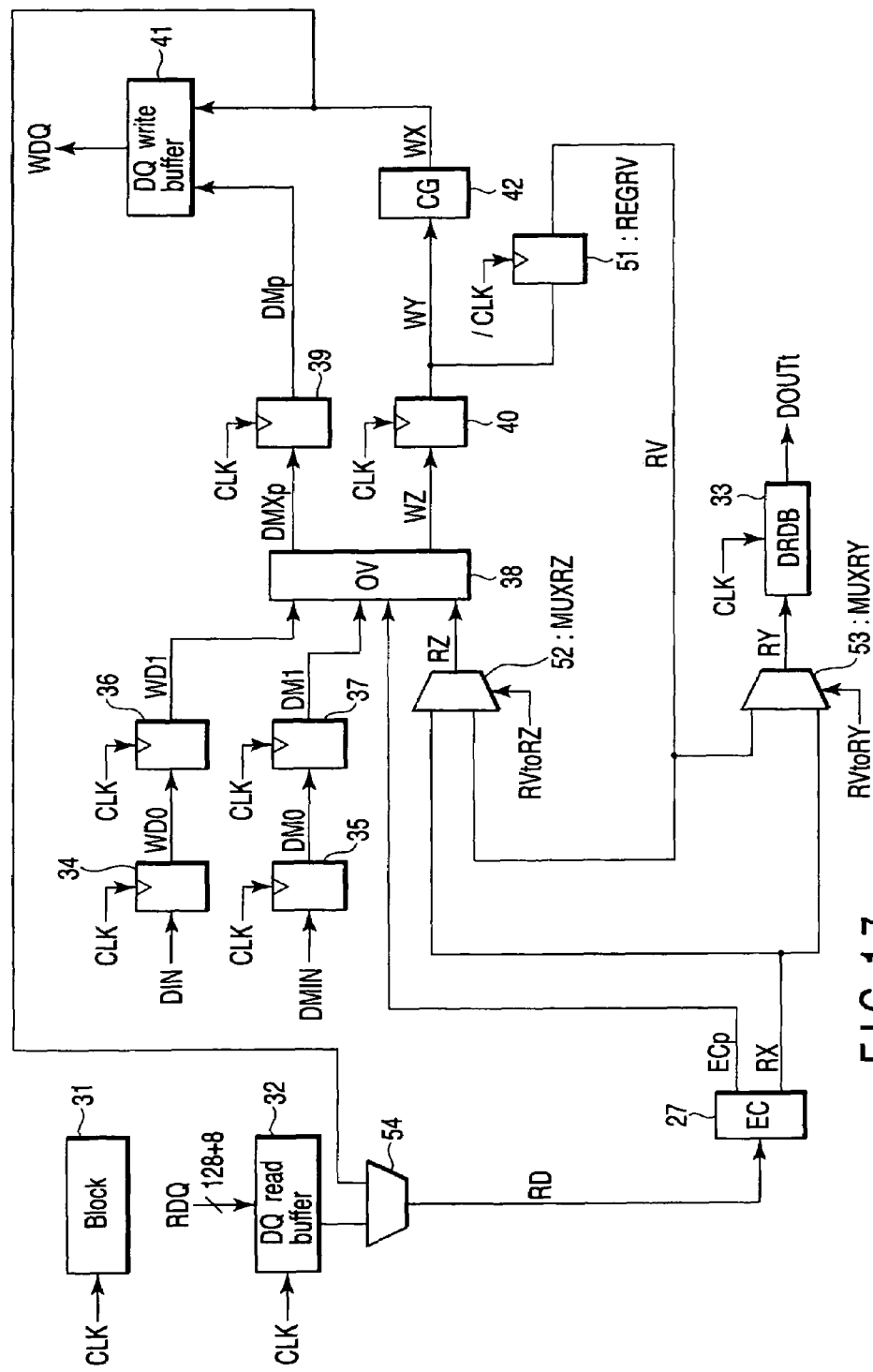
F I G. 17

SEMICONDUCTOR MEMORY IN WHICH ERROR CORRECTION IS PERFORMED BY ON-CHIP ERROR CORRECTION CIRCUIT

CROSS-REFERENCE TO RELATED APPLICATIONS

This application is based upon and claims the benefit of priority from prior Japanese Patent Application No. 2006-064428, filed Mar. 9, 2006, the entire contents of which are incorporated herein by reference.

BACKGROUND OF THE INVENTION

1. Field of the Invention

The present invention relates to a synchronous semiconductor memory which performs a pipeline operation and, more particularly, to a semiconductor memory in which error correction is performed by an on-chip error correction circuit.

2. Description of the Related Art

A synchronous semiconductor memory which operates in synchronism with an externally input clock signal in order to perform high-speed data transfer is known. Also, to improve the reliability, an on-chip error correcting technique using an error correction circuit is used (e.g., IEEE Spectrum April 2000, "Adding error-correcting circuitry to ASIC memory", Gray, K.; Spectrum, IEEE Volume 37, Issue 4, April. 2000, Pages: 55-60, Digital Object Identifier 10.1109/6.833029). This synchronous semiconductor memory having an error correcting function performs data write and read as follows.

In a write operation to a memory cell, 128 input information bits, for example, are directly written in the memory cell in the case of a systematic code, i.e., a code in which the same bits as information bits are contained in a code word. In addition, an 8-bit parity (also called check bits or code bits in some cases) is generated from the 128 information bits and written in a memory cell for parity bits.

In a read operation, the 128 information bits and 8 parity bits are read out from the memory cells to generate a syndrome. One information bit error can be corrected by decoding the generated syndrome.

It is sometimes necessary to write data having less than 128 bits by using a write mask function when the internal bus width is, e.g., 128 bits. Since, however, the write data has less than 128 bits, no correct code can be directly generated. Therefore, data must be read out once from a memory cell at the write address. This requires a so-called "read modify write" operation including read from the memory cell, error correction, overwrite of the write data, code generation, and write to the memory cell.

Accordingly, the data transfer rate decreases when the length of externally input write data is smaller than the internal bus width. This operation can occur not only when the write mask function is used, but also when the external bus width is smaller than the internal bus width.

BRIEF SUMMARY OF THE INVENTION

According to an aspect of the present invention, there is provided a synchronous semiconductor memory which performs a pipeline operation, comprising an error correction circuit configured to correct an error of data read out from a memory cell, a first write circuit configured to overwrite at least a portion of first write data externally input in response to a first write command on the data read out from the memory cell and corrected by the error correction circuit, and write the overwritten data in the memory cell, an output circuit configured to output the overwritten data outside a chip, and a second write circuit configured to reoverwrite at least a portion of externally input second write data on the overwritten data between a cycle in which the first write command is input and a cycle in which the overwritten data is written in the memory cell, encode the reoverwritten data, and write the encoded data in the memory cell.

According to another aspect of the present invention, there is provided a synchronous semiconductor memory which performs a pipeline operation, comprising a memory cell array, a first sense amplifier which performs amplification for data write and read to a selected memory cell in the memory cell array, a data input buffer which receives data, a code generator which generates a code for implementing an ECC function in data write, a DQ buffer which receives write data encoded by the code generator, supplies the write data to the first sense amplifier, and receives read data read out from the first sense amplifier, a syndrome generator which receives an information bit and a code bit read out from the memory cell array, and generates a syndrome, an error correction circuit which performs decoding and error correction on the syndrome output from the syndrome generator, and a data output buffer which outputs an output signal from the error correction circuit, wherein at least a portion of externally input write data is overwritten on read data read out from the memory cell and corrected by the error correction circuit, and the overwritten data is written in the memory cell and output outside from the data output buffer, and at least a portion of write data which is externally input at a different time is reoverwritten on the overwritten data, the reoverwritten data is encoded, and the encoded data is written in the memory cell.

According to still another aspect of the present invention, there is provided a synchronous semiconductor memory which performs a pipeline operation, comprising an error correction circuit configured to correct an error of data read out from a memory cell, a first write circuit configured to overwrite at least a portion of externally input first write data on the data read out from the memory cell and corrected by the error correction circuit, and write the overwritten data in the memory cell, a second write circuit configured to reoverwrite at least a portion of externally input second write data on the overwritten data, encode the reoverwritten data, and write the encoded data in the memory cell, and a command controller configured to output a first write command to the first write circuit at a first timing synchronized with a clock signal, and, at a second timing after the first timing, output one of a second write command and a read command to a column address as an object of control by the first write command, wherein when a read operation by the second command is necessary before write to the memory cell by the first write command is completed, the overwritten data as an input to code generation by the first write command is regarded as the readout corrected data of the second command.

BRIEF DESCRIPTION OF THE SEVERAL VIEWS OF THE DRAWING

FIG. 6 is a block diagram conceptually showing data paths in a semiconductor memory used in the study of achieving the present invention;

FIG. 12 is a block diagram for explaining the semiconductor memory according to the first embodiment of the present invention, in which some data paths are schematically shown;

FIG. 17 is a block diagram for explaining a semiconductor memory according to the fourth embodiment of the present invention, in which some data paths are schematically shown;

DETAILED DESCRIPTION OF THE INVENTION

Figure 1:
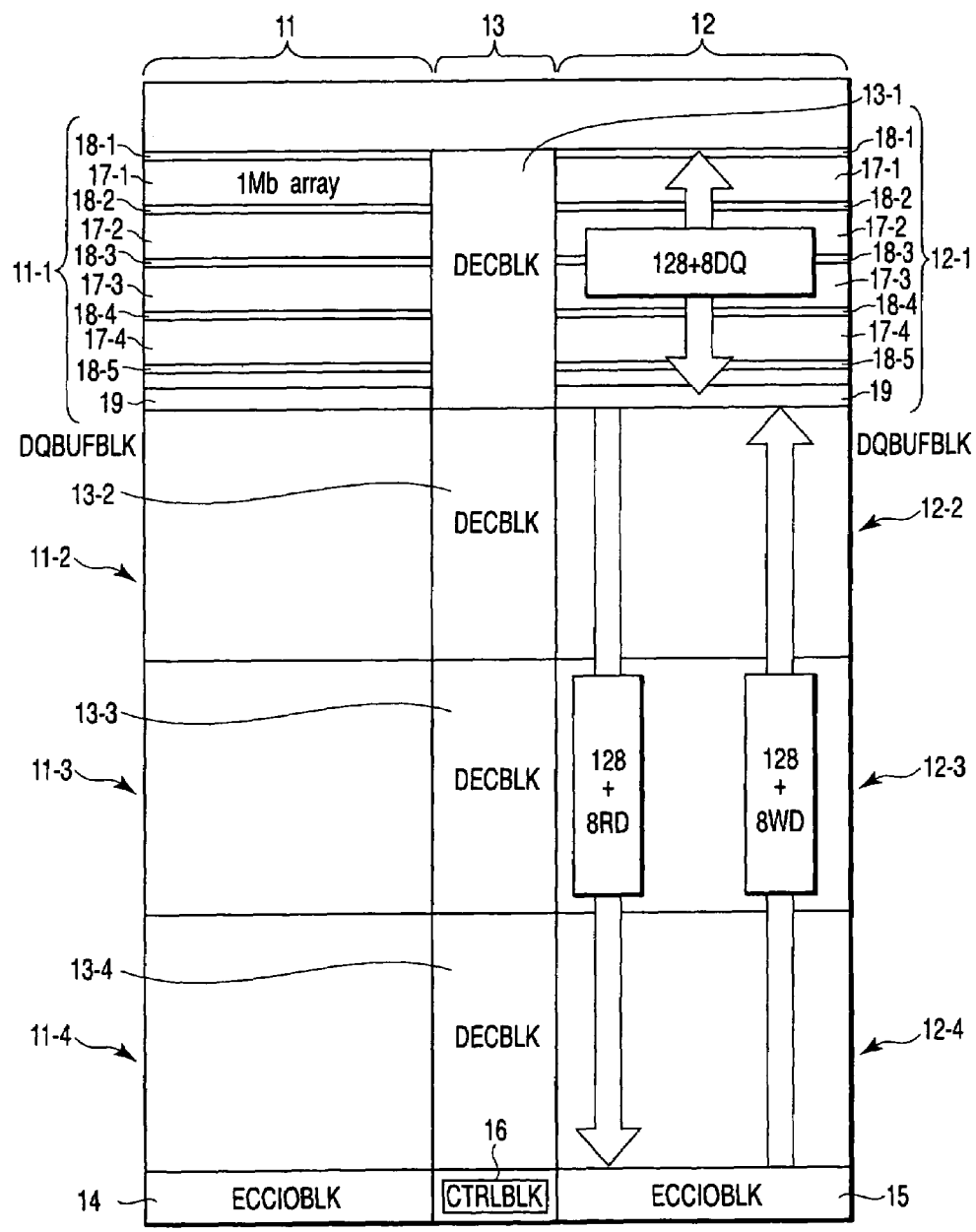
FIG. 1 is a block diagram for explaining a semiconductor memory according to the first embodiment of the present invention, in which the overall layout of clock synchronous type embedded DRAM macros is schematically shown.

FIG. 1 is a block diagram for explaining a semiconductor memory according to the first embodiment of the present invention, in which the overall layout of clock synchronous type embedded DRAM macros is schematically shown.

FIG. 1 specifically shows 32-Mbit DRAM macros 11 and 12 and a decoder 13 placed between the DRAM macros 11 and 12. The DRAM macros 11 and 12 respectively include four submacros 11-1 to 11-4 and four submacros 12-1 to 12-4, and decoder blocks (DECBLK) 13-1 to 13-4 are arranged between the submacros 11-1 to 11-4 and 12-1 to 12-4. ECC I/O blocks (ECCIOBLK) 14 and 15 are respectively arranged adjacent to the submacros 11-4 and 12-4. A control block (CTRLBLK) 16 is placed between the ECC I/O blocks 14 and 15.

Each of the submacros 11-1 to 11-4 and 12-1 to 12-4 forms a bank. Each bank comprises four 1-Mbit memory cell arrays (1 Mb array) 17-1 to 17-4, sense amplifiers 18-1 to 18-5, and a DQ buffer block (DQBUFBLK) 19.

Each of the memory cell arrays 17-1 to 17-4 includes 512 word lines, 2,048 bit line pairs, several spare bit line pairs, memory cells arranged at the intersections of the word lines and the bit line pairs, and the like. The sense amplifiers 18-1 to 18-5 sense and amplify signals read out from the memory cells to the bit line pairs. The sense amplifiers 18-1 to 18-5 are so arranged as to alternately sandwich the memory cell arrays 17-1 to 17-4.

The DQ buffer block 19 functions as a control circuit which controls the write of write data (128+8 WD) transmitted from the ECC I/O blocks 14 and 15 to memory cells, and transmits read data (128+8 RD) read out from memory cells to the ECC I/O blocks 14 and 15. The ECC I/O blocks 14 and 15 control an error correcting operation and input and output data. That is, each of the ECC I/O blocks 14 and 15 encodes externally input data DIN, and transmits the encoded data to the DQ buffer block 19. Also, when read data transmitted from the DQ buffer block 19 has an error, the ECC I/O block 14 or 15 corrects the error, and outputs the data outside the chip as output data DOUT.

Figure 2:
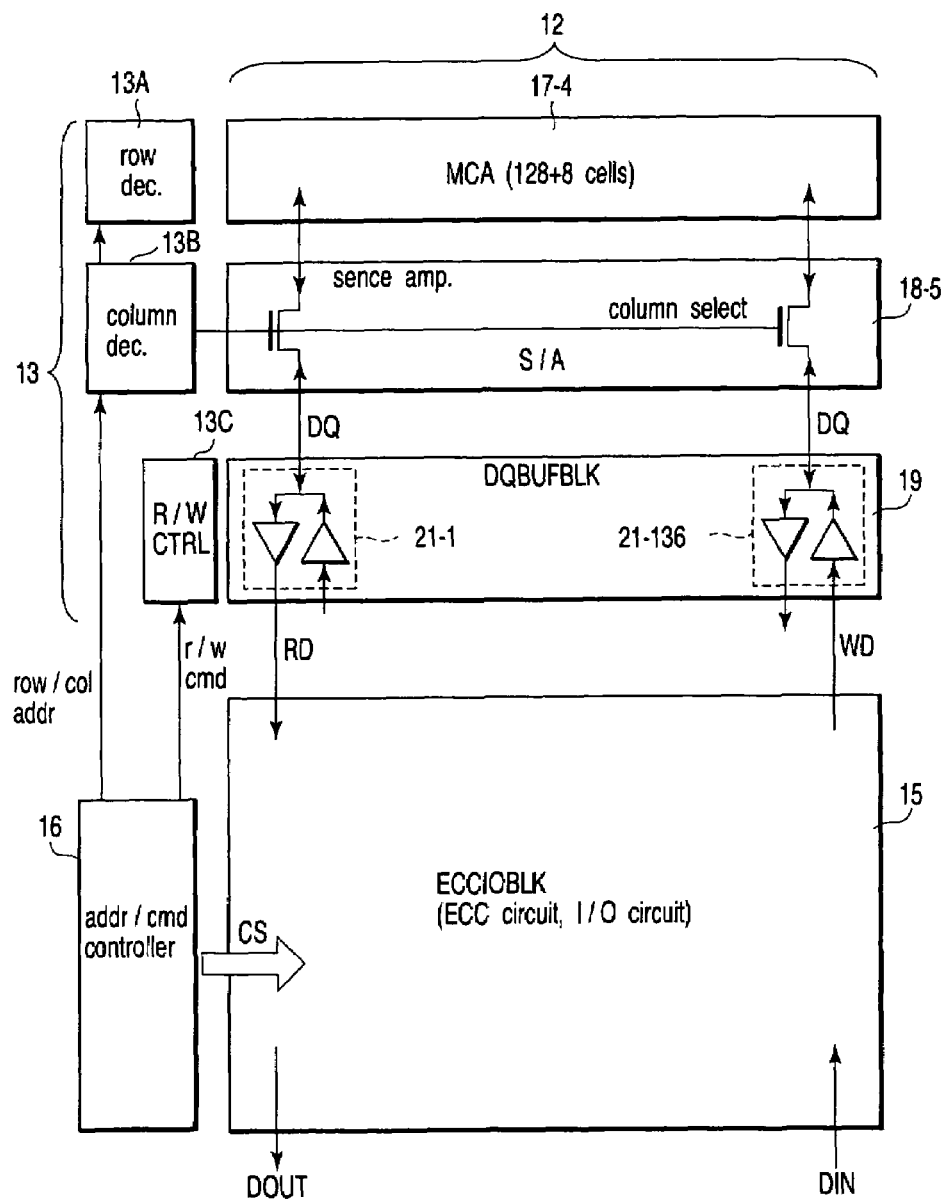
FIG. 2 is a block diagram schematically showing data paths in the DRAM macro shown in FIG. 1.

FIG. 2 is a block diagram schematically showing data paths in the DRAM macro shown in FIG. 1. FIG. 2 specifically shows the DRAM macro 12, decoder block 13, ECC I/O block 15, and control block 16. As shown in FIG. 2, the decoder block 13 includes a row decoder (row dec.) 13A, column decoder (column dec.) 13B, read/write controller (R/W CTRL) 13C, sense amplifier controller (not shown), and the like. The decoder block 13 controls, e.g., the operation of selecting a memory cell in the memory cell array 17-4, the sensing and amplifying operations of the sense amplifier 18-5, and the operation of the DQ buffer block 19.

The control block 16 functions as a control signal generator which generates various control signals, and includes an address controller and command controller (addr/cmd controller). The control block 16 receives a clock signal, address signal, command, and the like, and outputs an address signal (row/col addr) to the row decoder 13A and column decoder 13B, a read/write command (r/w cmd) to the read/write controller 13C, and a control signal CS to the ECC I/O block 15.

The control block 16 controls, e.g., the input of an address to an address input buffer, and the timings of the decoder block 13 and ECC I/O block 15.

The sense amplifier (S/A) 18-5 includes a sense amplifier (sense amp.) and column select transistor (column select). The DQ buffer block 19 has DQ buffers 21-1 to 21-136. The input data DIN is supplied to each of the DQ buffers 21-1 to 21-136 via a write data line WD, and written in a memory cell via a DQ line, the column select transistor, and the sense amplifier. Data read out from a memory cell is supplied to an I/O buffer via the sense amplifier, column select transistor, and DQ line, and read out as the output data DOUT via a read data line RD. The ECC I/O block 15 includes an ECC circuit and I/O circuit, and is controlled by the command controller 16.

Figure 3:
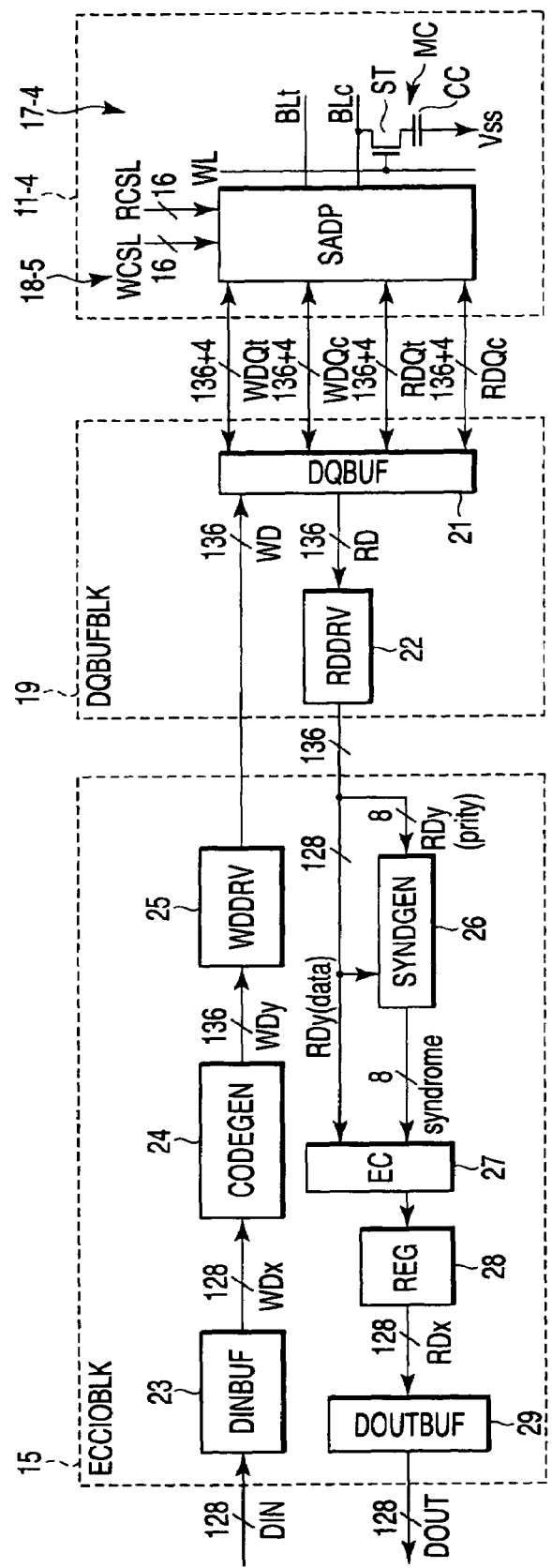
FIG. 3 is a block diagram showing details of the data paths by specifically showing a memory cell array, sense amplifier, DQ buffer block, and ECC I/O block in the DRAM macro shown in FIG. 1.

FIG. 3 shows details of the data paths by specifically showing the memory cell array 17-4, sense amplifier 18-5, DQ buffer block 19, and ECC I/O block 15 in the DRAM macro shown in FIG. 1.

In the memory cell array 17-4, a memory cell is formed at each intersection of a word line WL and a pair of bit lines BLt and BLc. As representatively indicated by a memory cell MC connected to the word line WL and bit line BLc, each memory cell MC is a dynamic cell and comprises a cell capacitor CC and selection transistor ST. One end of the current path of the selection transistor ST is connected to the bit line BLc, and the gate of the selection transistor ST is connected to the word line WL. The cell capacitor CC has one electrode connected to the other end of the current path of the selection transistor ST, and the other electrode connected to a ground point Vss.

The sense amplifier (SADP) 18-5 is connected to the pair of bit lines BLt and BLc. The sense amplifier 18-5 is a dual-port sense amplifier. Two data buses for a pair of RDQ lines (RDQt and RDQC) and a pair of WDQ lines (WDQt and WDQC) are connected to the sense amplifier 18-5. Two column select lines RCSL and WCSL are also connected to the sense amplifier 18-5. With this arrangement, read and write operations for different addresses can be simultaneously performed in parallel in the same cycle.

As will be described later, the sense amplifier 18-4 is also connected to the memory cell array 17-4. The sense amplifier 18-4 is also a dual-port sense amplifier. For example, the sense amplifier 18-4 is connected to odd-numbered bit line pairs in the memory cell array 17-4, and the sense amplifier 18-5 is connected to even-numbered bit line pairs in the memory cell array 17-4. In this manner, bit line pairs are selected by the sense amplifiers 18-4 and 18-5 arranged on the two sides of the memory cell array 17-4.

The DQ buffer block 19 which functions as a controller comprises a DQ buffer (DQBUF) 21 and RD line driver (RDDRV) 22. The DQ buffer 21 includes a DQ line read buffer and DQ line write buffer respectively connected to the pair of RDQ lines (RDQt and RDQc) and the pair of WDQ lines (WDQt and WDQc). The DQ buffer 21 controls redundancy by shifting a DQ line pair to be selected. The RD line driver 22 is formed in the middle of an RD line to drive it.

The ECC I/O block 15 comprises a data input buffer (DINBUF) 23, code generator (CODEGEN) 24, write data line (WD line) driver (WDDRV) 25, syndrome generator (SYNDGEN) 26, error correction circuit (EC) 27, register (REG) 28, data output buffer (DOUTBUF) 29, and the like.

The input data DIN is input to the data input buffer 23. The code generator 24 generates a code for implementing an EC function in data write. The WD line driver 25 drives a WD line. The syndrome generator 26 generates a syndrome in data read. The error correction circuit 27 decodes the syndrome and corrects an error. The register 28 latches the output from the error correction circuit 27. The data output buffer 29 outputs the output data DOUT.

In the above arrangement, the flow of data in a write operation is as follows. Assuming that the external data bus width is 128 bits, the input data DIN is supplied as 128-bit write data WDx to the code generator 24 via the input buffer 23. The code generator 24 generates a code by using the 128-bit write data WDx as information bits. Assume that a systematic Hamming code capable of correcting one error and detecting two errors is used as the code. Since 8 bits are enough for the check code length, the code length is 128 information bits+8 parity bits=136 bits.

Encoded 136-bit write data WDy is supplied to the WD line driver 25. The WD line driver 25 drives the WD line to transmit the data to the DQ buffer 21. The data is then written in a selected memory cell MC of the memory cell array 17-4 via the pair of write DQ lines WDQt and WDQc and the sense amplifier 18-5 (or 18-4). Note that the pair of write WDQ lines are a pair of 136-bit complementary signal lines WDQt and WDQc, and include a 4-bit DQ line pair component for column redundancy.

On the other hand, the flow of data in a read operation is as follows. Data containing parity bits for column redundancy and ECC is read out from a memory cell in the memory cell array 17-4 via the sense amplifier 18-5 (or 18-4), and input to the DQ buffer 21 via the pair of read DQ lines RDQt and RDQc having 140 (=136+4) bits. This data input to the DQ buffer 21 undergoes redundancy control, and is transmitted to the 136-bit RD line. The data read out to the RD line is amplified by the RD line driver 22, and supplied as read data RDy to the syndrome generator 26 and error correction circuit 27 in the ECC I/O block 15.

Of the 136-bit read data RDy on the RD line, 8 bits as parity bits RDy (parity) and 128 bits as information bits RDy (data) are input to the syndrome generator 26. On the basis of these parity bits and information bits, the syndrome generator 26 generates an 8-bit syndrome. The generated syndrome is supplied to and decoded by the error correction circuit 27. If data of the 128 information bits RDy (data) has an error and the error is correctable, the error correction circuit 27 corrects the error and supplies the corrected data to the register 28. Corrected information bits RDx (128 bits) are output outside as the output data DOUT via the data output buffer 29.

Figure 4:
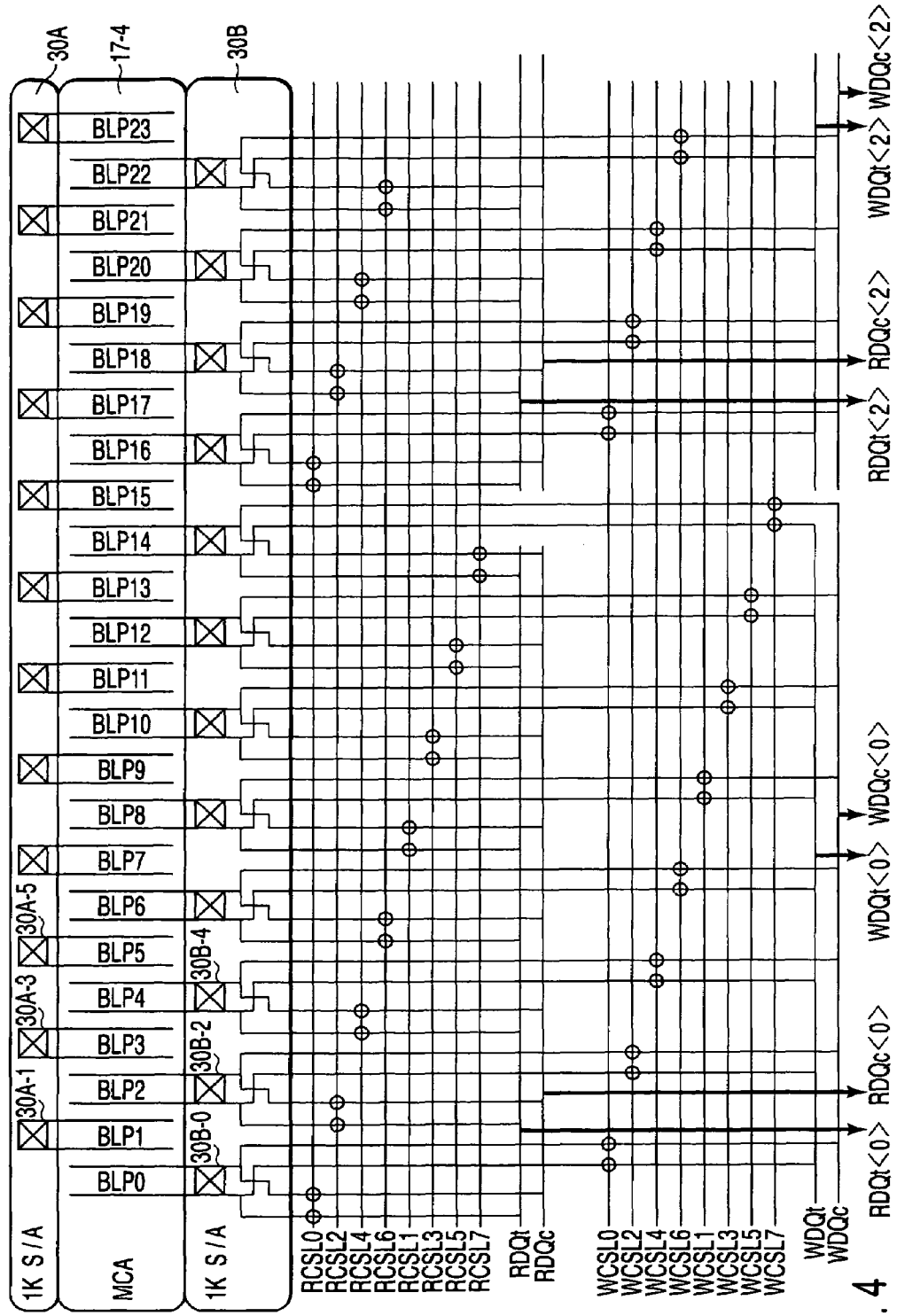
FIG. 4 is a circuit diagram showing the arrangement of a dual-port sense amplifier shown in FIG. 2.

FIG. 4 shows an example of the arrangement of the dual-port sense amplifier (SADP) 18-5 shown in FIG. 3. For the sake of simplicity, FIG. 4 shows only one side of the memory cell array (MCA) 17-4 in detail. Sense amplifier groups (1K S/A) 30A and 30B are arranged on the two sides of the memory cell array 17-4. Sense amplifiers 30A-1, 30A-3, 30A-5, . . . in the sense amplifier group 30A are respectively connected to odd-numbered bit line pairs BLP1, BLP3, BLP5, . . . Sense amplifiers 30B-0, 30B-2, 30B-4, . . . in the sense amplifier group 30B are respectively connected to even-numbered bit line pairs BLP0, BLP2, BLP4, . . . .

The sense amplifiers 30B-0, 30B-2, 30B-4, . . . are connected together to the pair of read DQ lines RDQt and RDQc and the pair of write DQ lines WDQt and WDQc via the current paths of transistors (simply indicated by symbols ◯). Each of the sense amplifiers 30B-0, 30B-2, 30B-4, . . . has a read circuit portion and write circuit portion. Read column select lines RCSL0 to RCSL7 are connected, for each DQ line pair, to the gates of the transistors connected to the pair of DQ lines RDQt and RDQc. Write column select lines WCSL0 to WCSL7 are connected, for each DQ line pair, to the gates of the transistors connected to the pair of DQ lines WDQt and WDQc.

The pair of DQ lines WDQt and WDQc are connected together to the bit line pairs in a predetermined unit, and read data from the memory cell array 17 and write data are transferred via a pair of DQ lines WDQt<0> and WDQc<0>, a pair of DQ lines WDQt<2> and WDQc<2> . . . .

Although not shown, the sense amplifiers 30A-1, 30A-3, 30A-5, . . . have the same circuit configuration.

To perform a write operation to a memory cell in the arrangement as described above, one of the write column select lines WCSL (WCSL0 to WCSL7) is selected, and a transistor having a gate connected to the selected write column select line WCSL is turned on. Consequently, data on the pair of write DQ lines WDQt and WDQc is amplified by a sense amplifier 30B-i (i=0, 1, 2, 3, . . . ), supplied to a bit line pair BLPi, and written in the memory cell.

To perform a read operation from a memory cell, one of the read column select lines RCSL (RCSL0 to RCSL7) is selected, and a transistor having a gate connected to the selected read column select line RCSL is turned on. Consequently, data of the memory cell is amplified by a sense amplifier 30B-j (j=0, 1, 2, 3, . . . ), and read out to the pair of read DQ lines RDQt and RDQC.

When read and write operations for different column addresses, e.g., a read operation for the read column select line RCSL0 and a write operation for the write column select line WCSL1 are to be simultaneously performed, data of the bit line pair BLP0 is read out to the pair of read DQ lines RDQt<0> and RDQc<0>, and data of the pair of write DQ lines WDQt<0> and WDQc<0> is transmitted to the bit line pair BLP8 and written in a memory cell.

A case in which a pipeline operation is performed in a synchronous semiconductor memory including an ECC circuit and dual-port sense amplifier will be explained below with reference to FIGS. 5A and 5B.

Figure 5A:
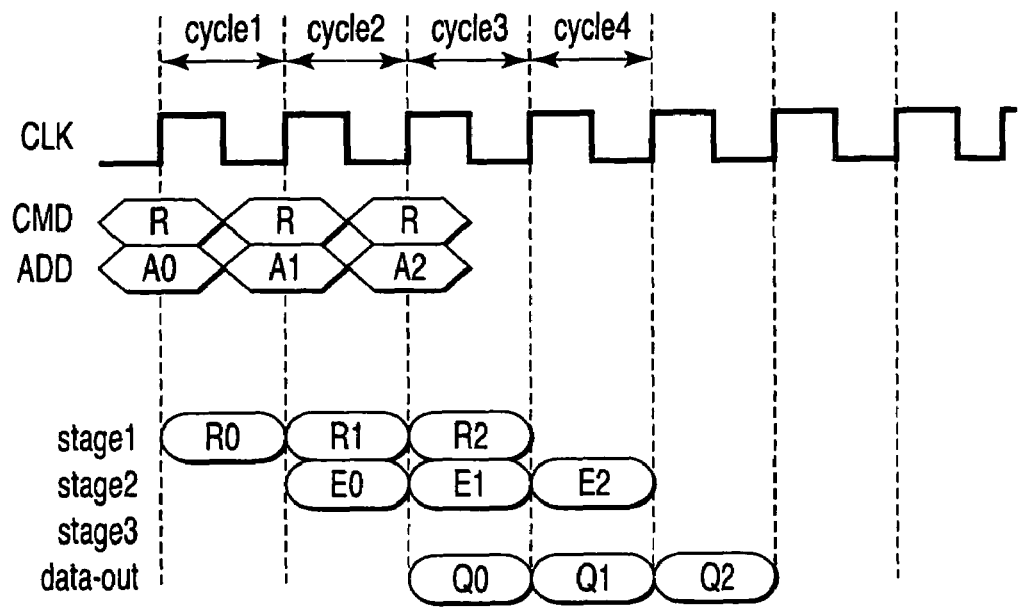
FIG. 5A is a timing chart for explaining an operation having a latency of 3 in a three-stage pipeline configuration, in which a read operation is shown.
Figure 5B:
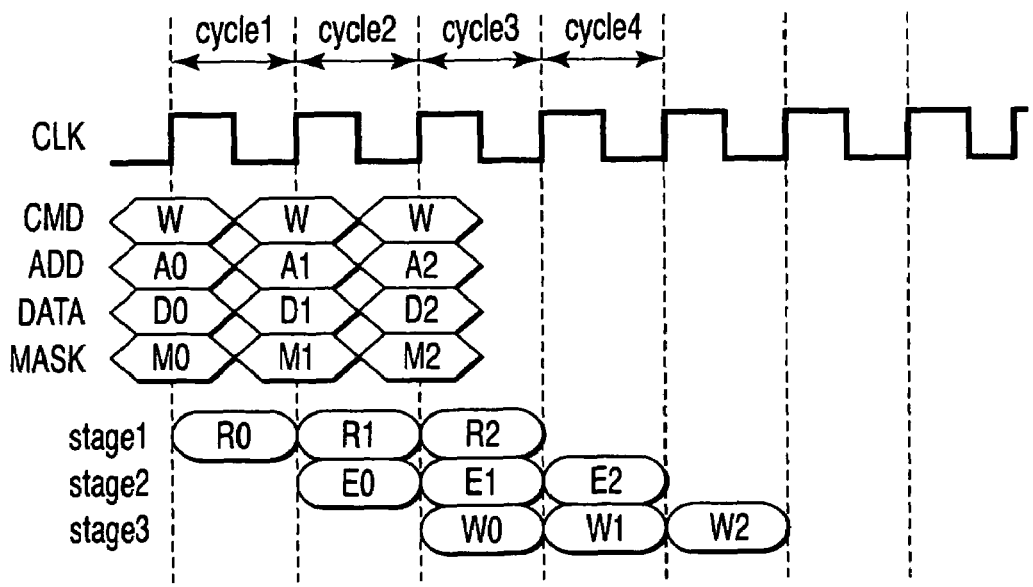
FIG. 5B is a timing chart for explaining the operation having a latency of 3 in the three-stage pipeline configuration, in which a write operation is shown.

FIGS. 5A and 5B are timing charts for explaining an operation having a latency of 3 in a three-stage pipeline configuration. FIG. 5A shows a read operation, and FIG. 5B shows a write operation. As shown in FIG. 5A, commands (CMD) R, R, and R for designating a read operation and target addresses (ADD) A0, A1, and A2 are input in response to the leading edges of a clock signal CLK. In the first stage (stage 1), therefore, read data R0, R1, and R2 are transferred in response to the leading edges of the clock signal CLK. In the second stage, error-corrected data E0, E1, and E2 of the read data in the respective preceding cycles are transferred. From the third clock of the clock signal CLK, i.e., from cycle 3, output data Q0, Q1, and Q2 respectively corresponding to the read data R0, R1, and R2 are sequentially output (data-out).

FIG. 5B shows a write operation when consecutive write commands are input in the three-stage pipeline configuration. Write commands (CMD) W, W, and W, addresses (ADD) A0, A1, and A2, write data (DATA) D0, D1, and D2, and mask data (MASK) M0, M1, and M2 are input in response to the leading edges of the clock signal CLK.

The write data are externally input together with the write commands because when read modify write is to be performed by a clock synchronous type DRAM having an error correcting function, after an error is corrected, a code must be generated by overwriting the input write data smaller than 128 bits on the corrected data.

In the first stage, read data R0, R1, and R2 are transferred in response to the leading edges of the clock signal CLK. In the second stage, error-corrected data E0, E1, and E2 of the read data in the respective preceding cycles are transferred. From the third clock of the clock signal CLK, i.e., from cycle 3, write data W0, W1, and W2 respectively corresponding to the input data D0, D1, and D2 are transferred in the third stage to perform the write operation.

FIG. 6 is a block diagram conceptually showing data paths in a semiconductor memory used in the study of achieving the present invention. Although the data paths are expressed in the form of a block diagram, this diagram does not necessarily show actual circuit blocks.

First, a mask write operation when a pipeline operation is to be performed by a latency of 3 will be explained.

In the first stage, a command and address are input to a block 31 to which a clock signal CLK is input, and these command and address are decoded to activate a corresponding read column select line RCSL. Consequently, data of 128 information bits and 8 parity bits is read out onto a read DQ line pair (RDQ line pair) from a memory cell corresponding to the input column address. Also, externally input write data DINt and data mask information DM are input to latches (flip-flops) 34 and 35 in response to the first leading edge of the clock signal CLK, and write data WD0 and data mask information DM0 are output from the latches 34 and 35.

In the second stage, the data on the RDQ line pair is input to a DQ read buffer 32 in response to the second leading edge of the clock signal CLK, and read out to an RD line. If the data on the RDQ line pair has a 1-bit error, the data is read out onto a signal line RX after the error is corrected by an error correction circuit (EC) 27. In this case, error position information ECp corresponding to the error bit goes high. The write data WD0 and write mask (data mask information) DM0 are input to latches 36 and 37 in response to the second leading edge of the clock signal CLK, and input as write data WD1 and a write mask DM1 to a data overwrite logic circuit (OV).

An output signal WZ from the data overwrite logic circuit 38 is obtained by overwriting, with unmasked write data, the data which is read out from the memory cell and corrected. Also, an output signal DMXp from the data overwrite logic circuit 38 is obtained without masking bits corresponding to the information ECp indicating the position of an error corrected in the input data mask information DM.

Then, the data mask information DMXp and overwritten write data WZ are input to latches 39 and 40 in response to the third leading edge of the clock signal CLK. Mask information DMp output from the latch 39 is transferred to a DQ write buffer 41. Overwritten write data WY output from the latch 40 is input to a code generator (CG) 42 to generate a code WX. The code WX is transmitted from the DQ write buffer 41 to a WDQ line pair in accordance with the mask information DMp, and written in a memory cell of a column selected by a write column select line WCSL corresponding to the same address as in the first stage.

Figure 7:
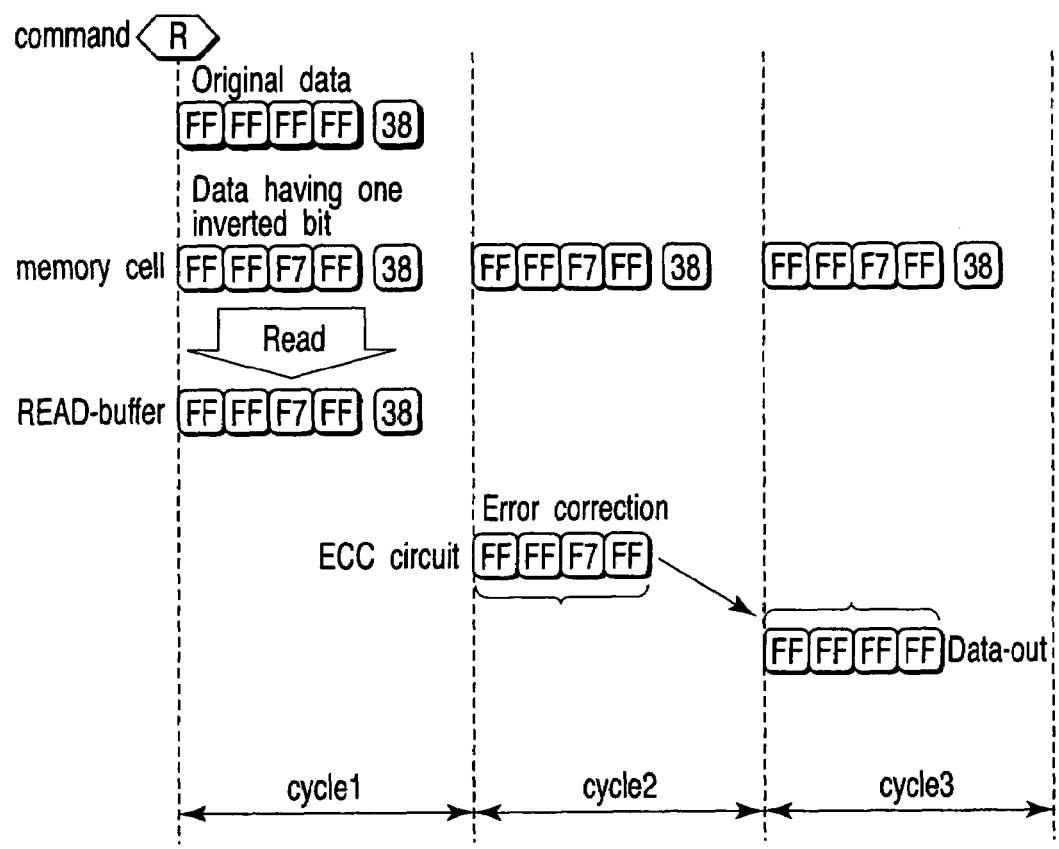
FIG. 7 is a schematic view for explaining the data flow of read in the semiconductor memory used in the study of achieving the present invention.

The flow of data when it is read out from the semiconductor memory described above will be briefly explained below. FIG. 7 is a view for explaining the data flow of read in the semiconductor memory used in the study of achieving the present invention. To avoid the explanation from being complicated, the information length is not limited to 128 bits. Assume that data written in a memory cell corresponding to a certain column address is "FFFFFFFF", and the corresponding parity bits are, e.g., "38" (original data). Assume also that one bit of the data in this memory cell is inverted for some reason, e.g., by a soft error, thereby producing data "FFFFF7FF". When a read command R is input in a certain cycle (cycle 1) with this error being held, "FFFFF7FF 38" is read out from the memory cell corresponding to this column address to the DQ read buffer (READ-buffer) 32.

In cycle 2, the error correction circuit 27 corrects the information bits to "FFFFFFFF" by error correction.

In cycle 3, the correct data "FFFFFFFF" is output outside the macro.

Figure 8:
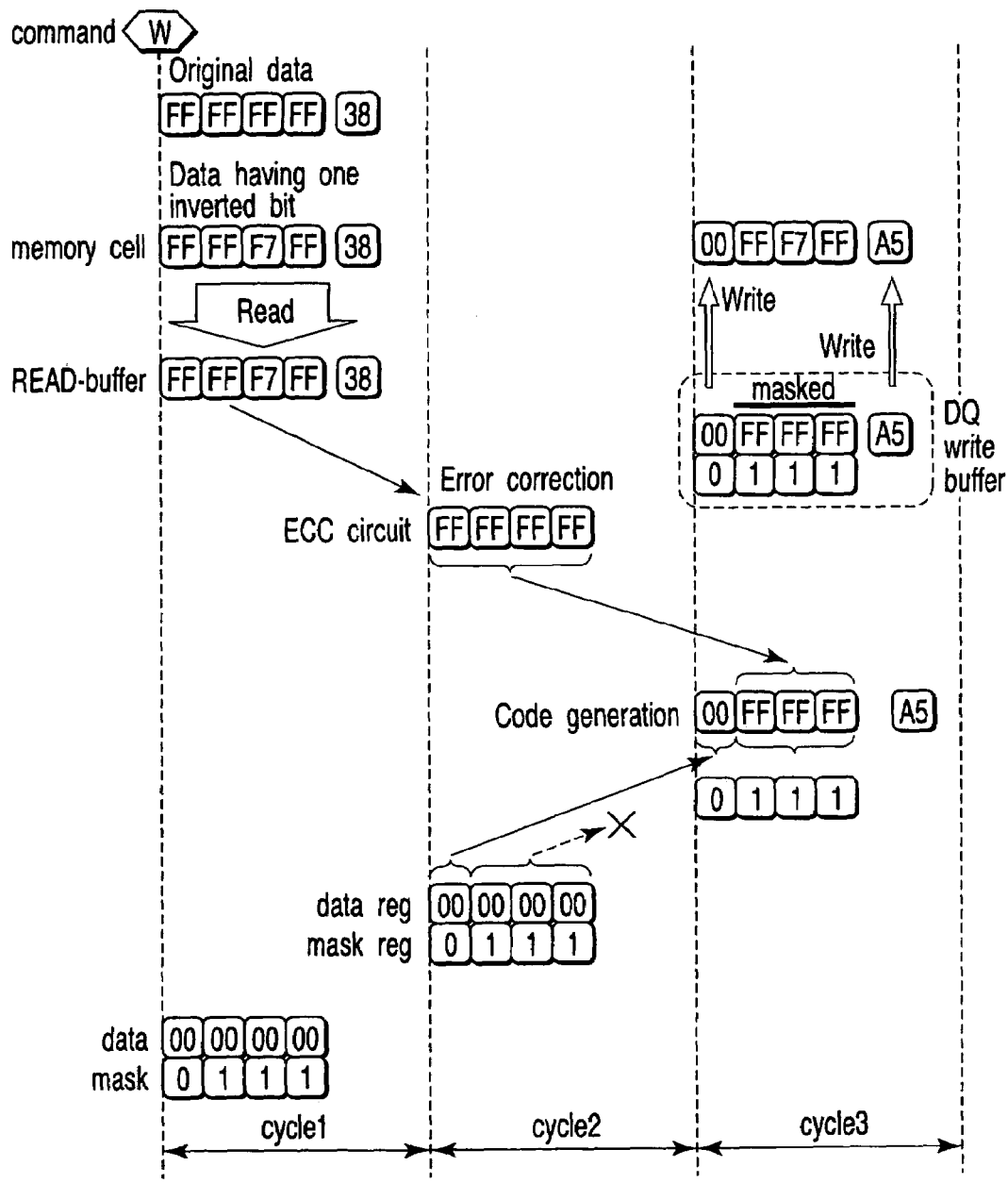
FIG. 8 is a schematic view for explaining the first data flow of write in the semiconductor memory used in the study of achieving the present invention.

FIG. 8 shows the first data flow of write in the semiconductor memory used in the study of achieving the present invention. Data read and error correction are the same as in the read operation explained with reference to FIG. 7, and the readout corrected data is "FFFFFFFF".

On the other hand, input write data (data) is "00000000", and a mask is "0111". Accordingly, only the first (uppermost) byte of the data is written, and the three right-side (lower) bytes are masked. On the basis of the readout corrected data "FFFFFFFF", write data "00000000", and mask information "0111", data to be written back in the memory cell is "00FFFFFF". If a parity generated from the information bits is, e.g., "A5", this code word "00FFFFFF A5" need only be written back in the memory cell. Since the masked bits need not be written back in the memory cell, only the unmasked portion and parity may also be written.

Note that in the latter case, the corrected bit is not written back, so one bit error exits when the data is read out again. However, this error is correctable by the error correcting capability. Although the reliability decreases, therefore, the error can be corrected when the data is read out again, so no problem arises in the operation as long as no more error occurs.

Figure 9:
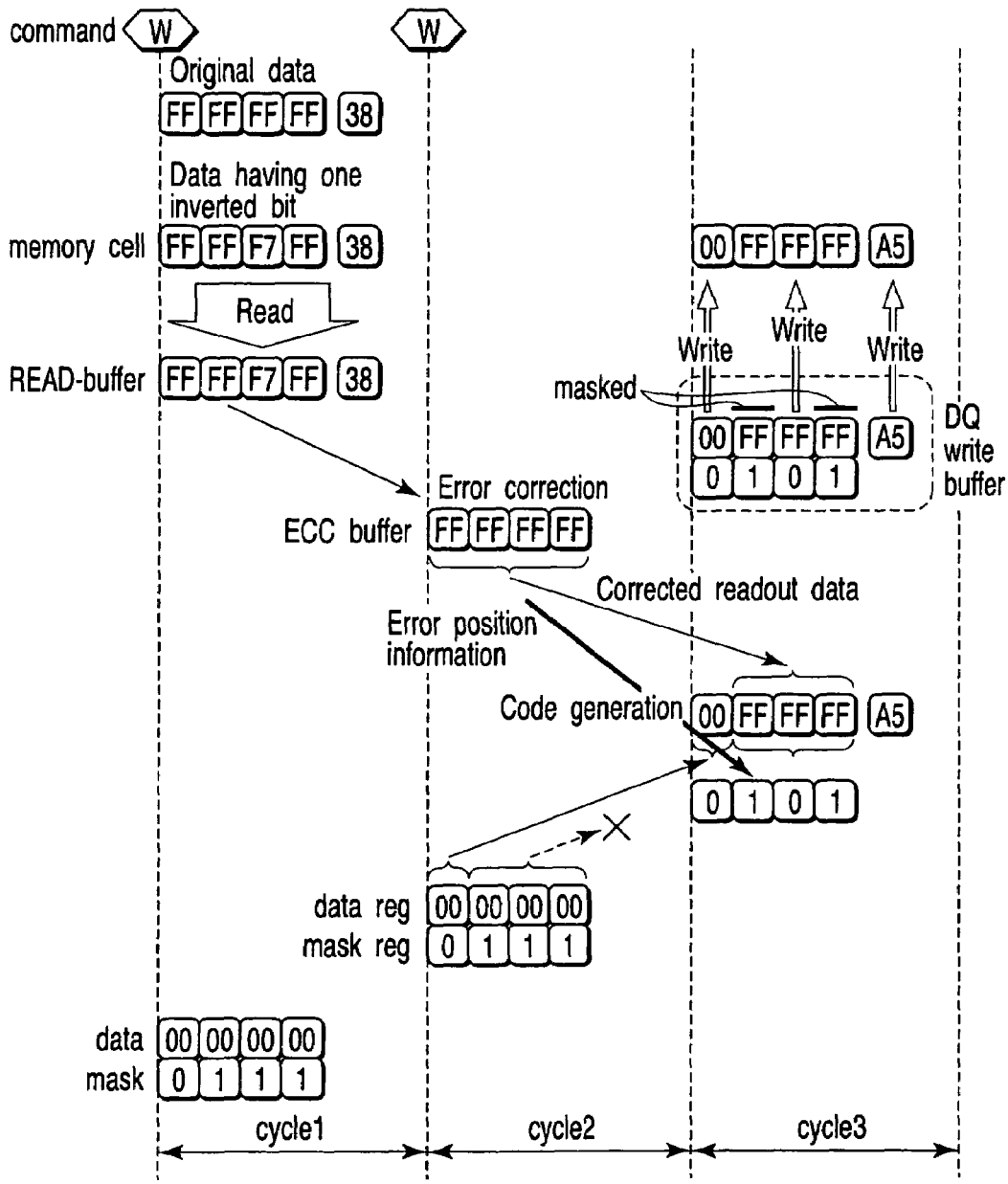
FIG. 9 is a schematic view for explaining the second data flow of write in the semiconductor memory used in the study of achieving the present invention.

To avoid the decrease in reliability, it is also possible to correct mask information in accordance with error position information, as shown in FIG. 9, when a corrected bit is to be written back, thereby unmasking the bit (or byte) having undergone error correction.

When a pipeline operation like this is performed, however, a problem may arise when the same address as a command input in a certain cycle is contained in any of a plurality of commands input in a few cycles before and after the certain cycle.

This problem will be explained below by taking some cases as examples.

Figure 10:
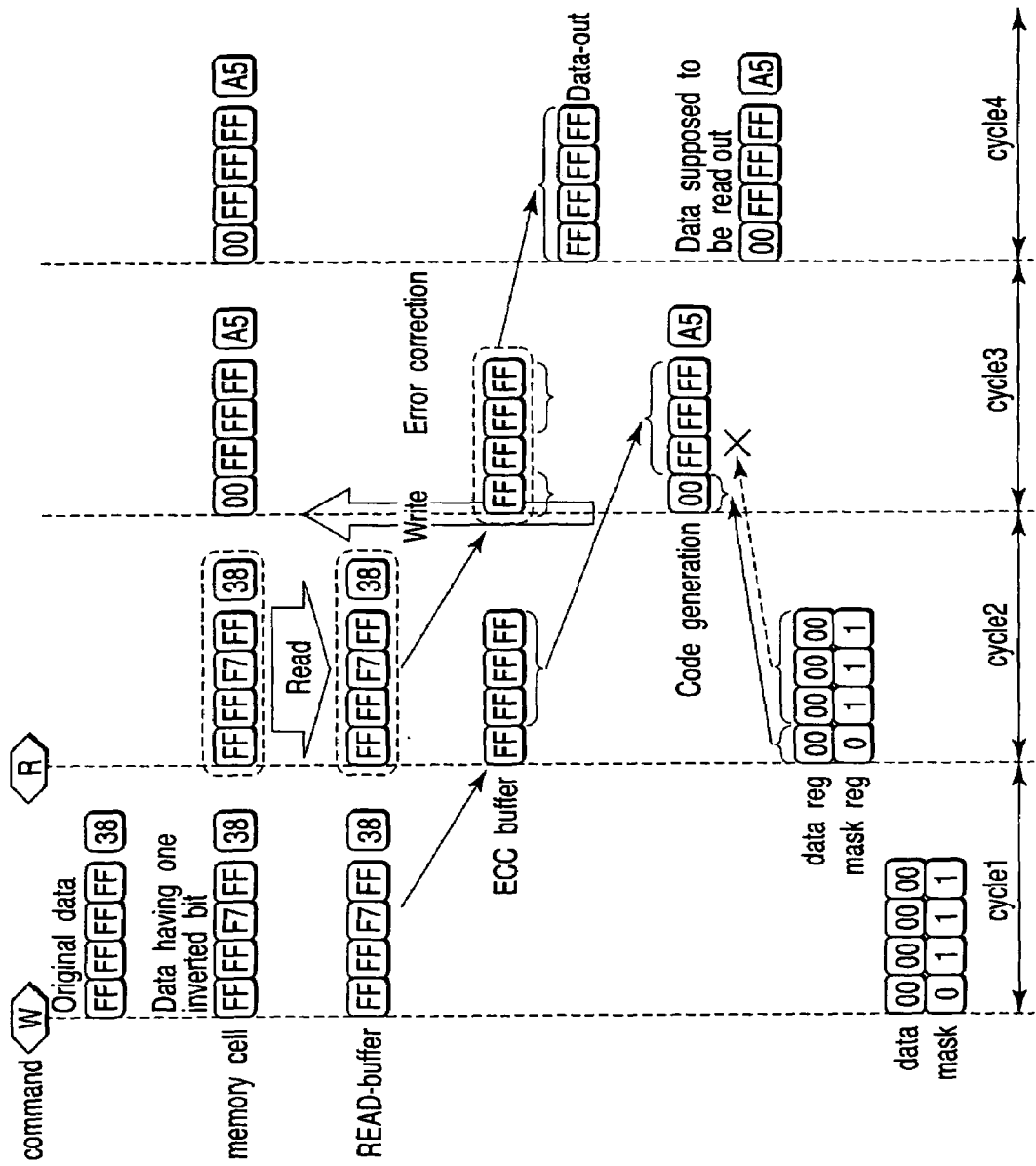
FIG. 10 is a schematic view showing a data flow when a write command for a certain address is input and then a read command for the same address is input in the next cycle.

FIG. 10 schematically shows a data flow when a write command for a certain address is input and then a read command for the same address is input in the next cycle.

An operation for a first write command W is exactly the same as in FIG. 9, so an explanation thereof will be omitted.

An operation for a read command R as the second command is the same as explained with reference to FIG. 7. That is, data "FFFFF7FF 38" read out from a memory cell in cycle 2 is corrected to "FFFFFFFF" in cycle 3, and output outside the macro in cycle 4.

Since, however, the data written in the memory cell in cycle 3 with respect to the first command is "00FFFFFF A5", data to be output should be "00FFFFFF" when a read command for the same address is input after this write command. That is, incorrect data is output.

Figure 11:
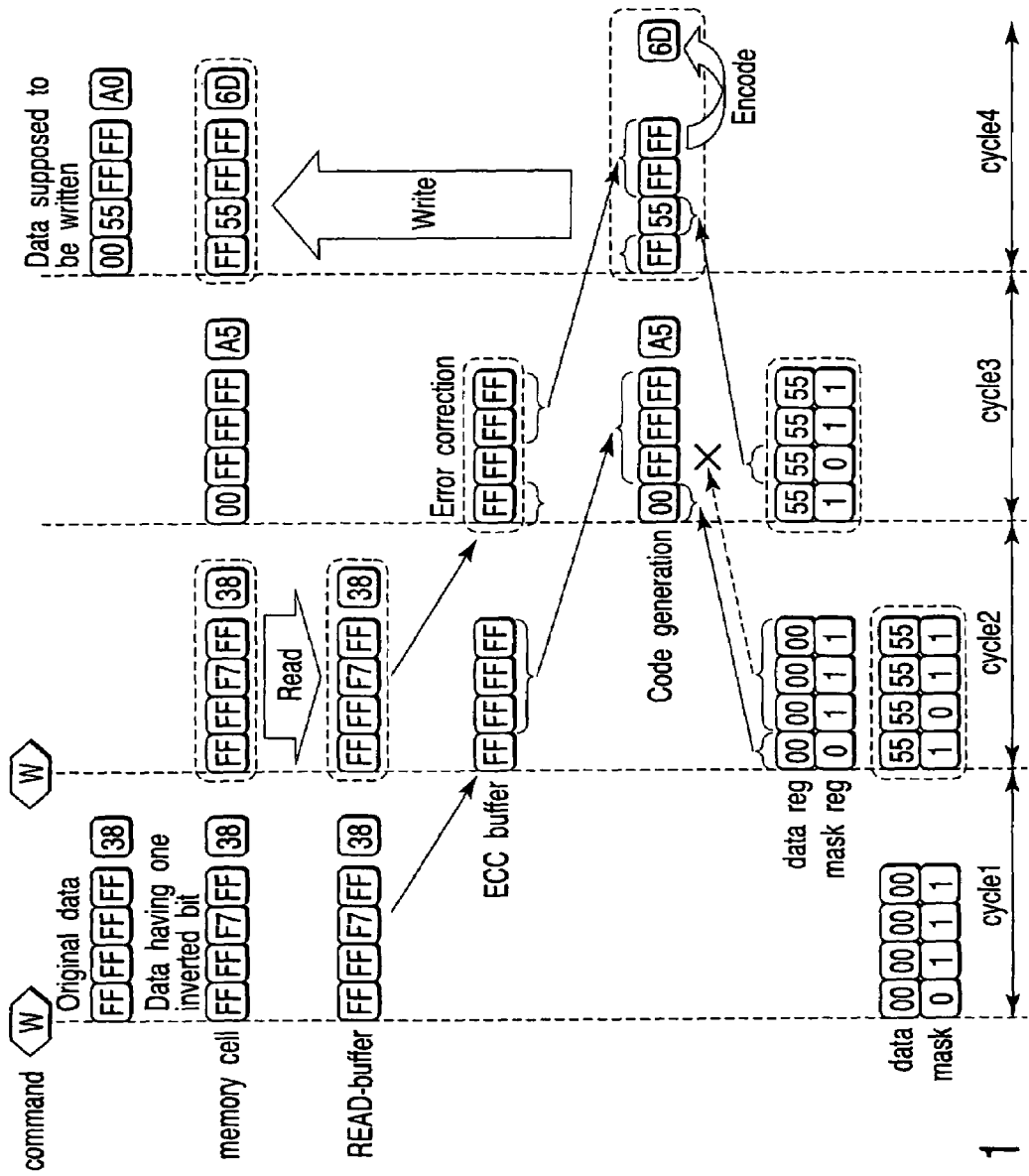
FIG. 11 is a schematic view showing a data flow when two consecutive write commands designate the same column address.

FIG. 11 is a schematic view showing a data flow when two consecutive write commands designate the same column address.

An operation for a first write command W is exactly the same as in FIG. 9, so an explanation thereof will be omitted.

In an operation for a second write command W, data is read out from a memory cell in cycle 2. Since the address of this memory cell is the same as the address designated by the first write command, the contents of the memory cell are the same as those read out in cycle 1. In this case, "FFFFF7FF 38" is read out to the DQ read buffer 32 in cycle 2, and corrected to "FFFFFFFF" in cycle 3.

On the other hand, write data is "55555555" and a mask is "1011", so a parity "6D" is generated from overwritten data "FF55FFFF", and "FF55FFFF 6D" is written in the memory cell. However, this data is incorrect. Since the cell data before the command is input is "FFFFF7FF 38", "00FFFFFF A5" is expected after the first write command is input. On the other hand, when the second write command for which the write data is "55555555" and the mask is "1011" is input, "0055FFFF A0" should be written in the cell.

In this case, it is assumed that parity bits for the information bits "0055FFFF" are "A0".

As described above, in the semiconductor memory which performs a pipeline operation in synchronism with the clock signal CLK and has an error correcting function, when a column command for the same address as the second column command is input in any of a plurality of cycles before and after the first column command is input, incorrect data may be read out or written in a memory cell.

The first embodiment of the present invention, therefore, makes it possible to read out correct data and write correct data in a memory cell, on the basis of the above consideration, even when a column command for the same address as the second column command is input in any of a plurality of cycles before and after the first column command is input.

Embodiments of the present invention will be described in detail below.

First Embodiment

FIG. 12 is a block diagram for explaining a semiconductor memory according to the first embodiment of the present invention, in which some data paths are schematically illustrated. Note that this block diagram does not directly express the circuit of the embodiment, i.e., this block diagram is a conceptual view and schematically expresses the circuit as a diagram. The difference of FIG. 12 from FIG. 6 is the addition of a register (REGRV) 51, multiplexer (MUXRZ) 52, and multiplexer (MUXRY) 53. The register 51 is controlled by an inverted clock signal /CLK generated from a clock signal CLK described above. When the clock signal /CLK is input, write data WY output from a latch 39 is transmitted as a signal RV to one input terminal of each of the multiplexers 52 and 53.

If a select signal RVtoRZ whose state is determined in accordance with predetermined conditions goes high, the multiplexer 52 selects the signal RV and supplies it as a signal RZ to a data overwrite logic circuit OV. If the select signal RVtoRZ is low, the multiplexer 52 selects a conventional signal RX and supplies it as the signal RZ to the data overwrite logic circuit OV.

Also, when a select signal RVtoRY whose state is determined in accordance with predetermined conditions goes high, the multiplexer 53 selects the signal RV and supplies it as a signal RY to a data output circuit 33. If the select signal RVtoRY is low, the multiplexer 53 selects the signal RX and supplies it as the signal RY to the data output circuit 33.

In a three-stage pipeline configuration having an ECC function as described above, the signal RVtoRZ goes high when a write command following another write command for a certain address designates the same address. Also, the signal RVtoRY goes high when a read command following a write command for a certain address designates the same address.

Although some changes may of course be necessary depending on the pipeline configuration, the basic configuration is obtained by the concept as described above.

Figure 13:
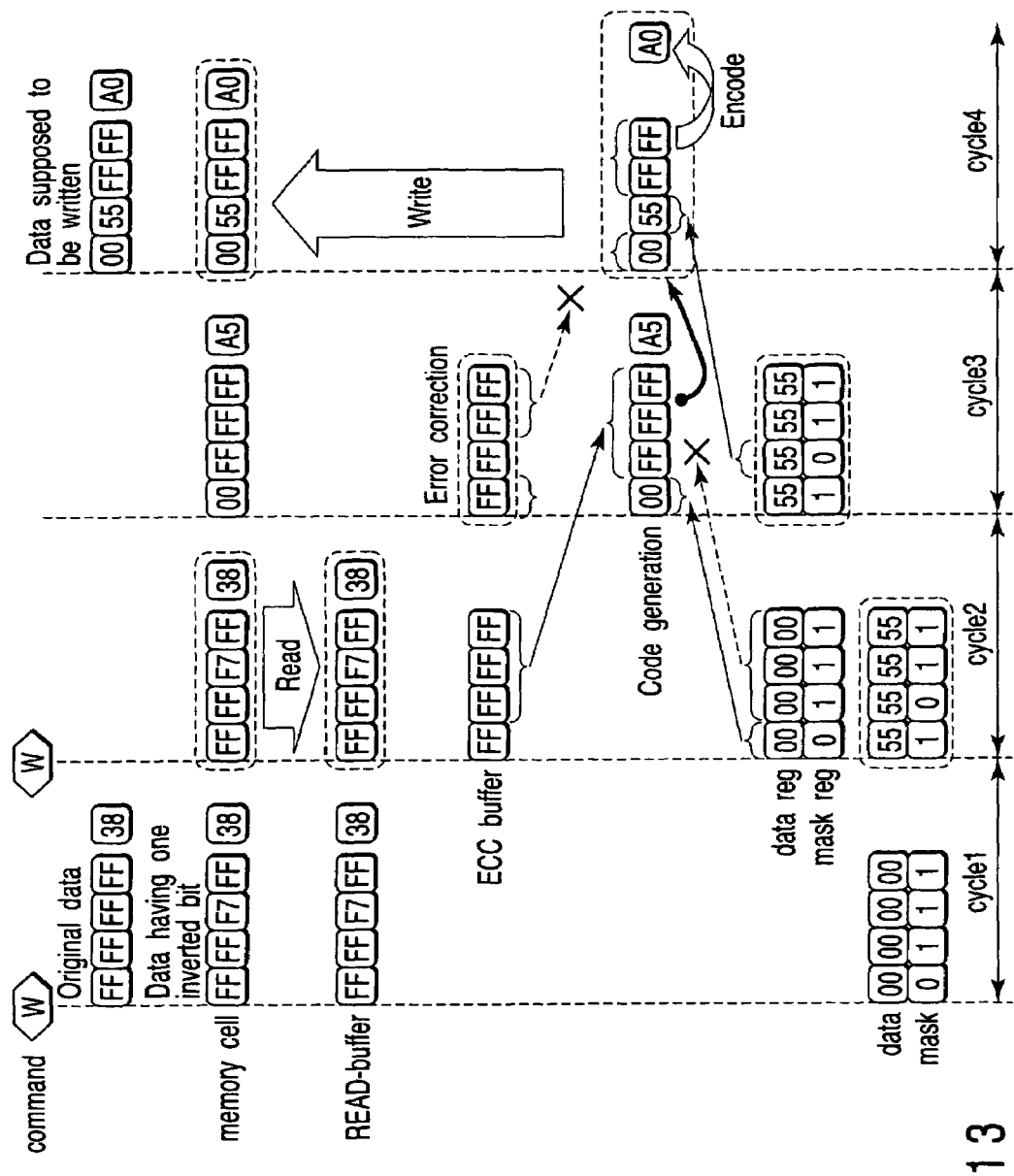
FIG. 13 is a schematic view showing the data flow of a continuous write operation for the same address in the semiconductor memory according to the first embodiment of the present invention.

FIG. 13 schematically shows the data flow of a continuous write operation for the same address in the semiconductor memory according to the first embodiment of the present invention. In this embodiment, when a second write command is input, data "FFFFFFFF" read out from a memory cell in cycle 2 and corrected in cycle 3, i.e., the signal RX shown in FIG. 12, is not used in encoding by this write command. However, when a first write command is input, data "00FFFFFF" used in code generation in cycle 3, i.e., the signal RV shown in FIG. 12, is input to the data overwrite logic circuit OV, and overwritten data (write data) WY is used in code generation in cycle 4.

In this manner, a correct code word "0055FFFF A0" can be written in the memory cell in cycle 4.

On the other hand, although not shown, in a read operation which is performed for the same address subsequently to the write operation, the overwritten data used in code generation in the first write operation is selected by the multiplexer 53 shown in FIG. 12. The output signal RY from the multiplexer 53 is output outside the macro from the data output circuit 33. The data output circuit 33 also outputs correct data "0055FFFF".

Accordingly, the first embodiment of the present invention can transfer data at a high speed even when the length of externally input write data is smaller than the internal bus width. In addition, even when a column command for the same address as the second column command is input in any of a plurality of cycles before and after the first column command is input, it is possible to read out correct data and write correct data in a memory cell.

Second Embodiment

Figure 14:
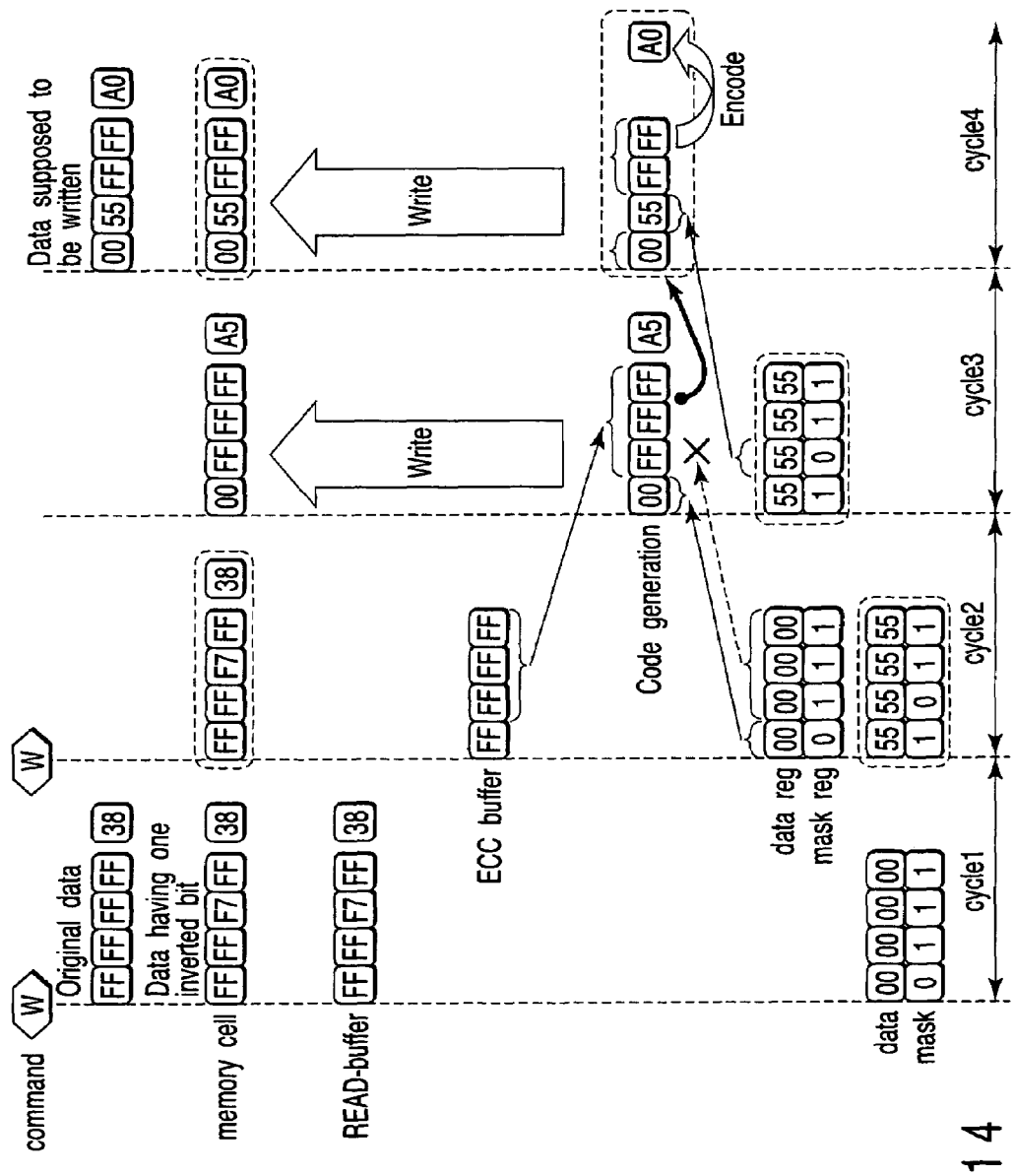
FIG. 14 is a schematic view for explaining a semiconductor memory according to the second embodiment of the present invention, in which another data flow of the continuous write operation for the same address is shown.

FIG. 14 is a view for explaining a semiconductor memory according to the second embodiment of the present invention, in which another data flow of the continuous write operation for the same address is schematically illustrated. That is, when write for the same address as the second write is performed following the first write in the first embodiment shown in FIGS. 12 and 13, read from the memory cell and error correction in the second write operation are omitted.

The corrected data is not used in encoding in cycle 4 shown in FIG. 14. Accordingly, unnecessary power consumption can be suppressed by omitting read from the memory cell and error correction in the second write operation.

Third Embodiment

Figure 15:
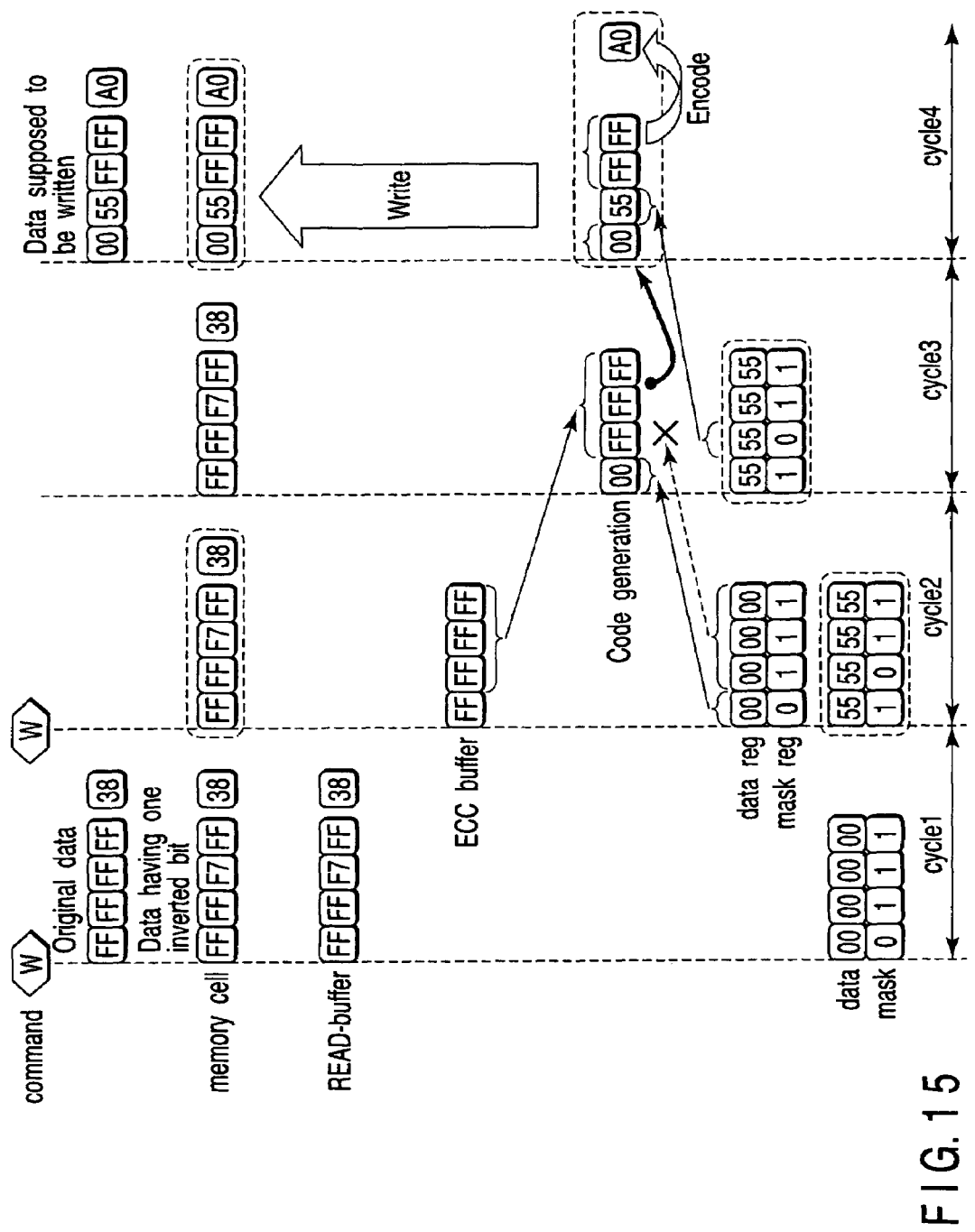
FIG. 15 is a schematic view for explaining a semiconductor memory according to the third embodiment of the present invention, in which still another data flow of the continuous write operation for the same address is shown.

FIG. 15 is a view for explaining a semiconductor memory according to the third embodiment of the present invention. The third embodiment is obtained by further improving the second embodiment described above.

That is, in the third embodiment, when write for the same address as the second write is performed following the first write, not only read from the memory cell and error correction in the second write operation are omitted in the same manner as in the second embodiment, but also code generation and write to the memory cell in cycle 3 of the first write operation are omitted.

This is so because correct data is written in the memory cell in cycle 4 by the second write operation. In this write operation in cycle 4, however, it is necessary to write all bits of the code by neglecting the mask information, or write both bits not masked by the first write and bits not masked by the second write.

Unnecessary power consumption can be suppressed by omitting read from the memory cell and error correction in the second write operation, and omitting code generation and write to the memory cell in cycle 3 of the first write operation as described above.

Figure 16:
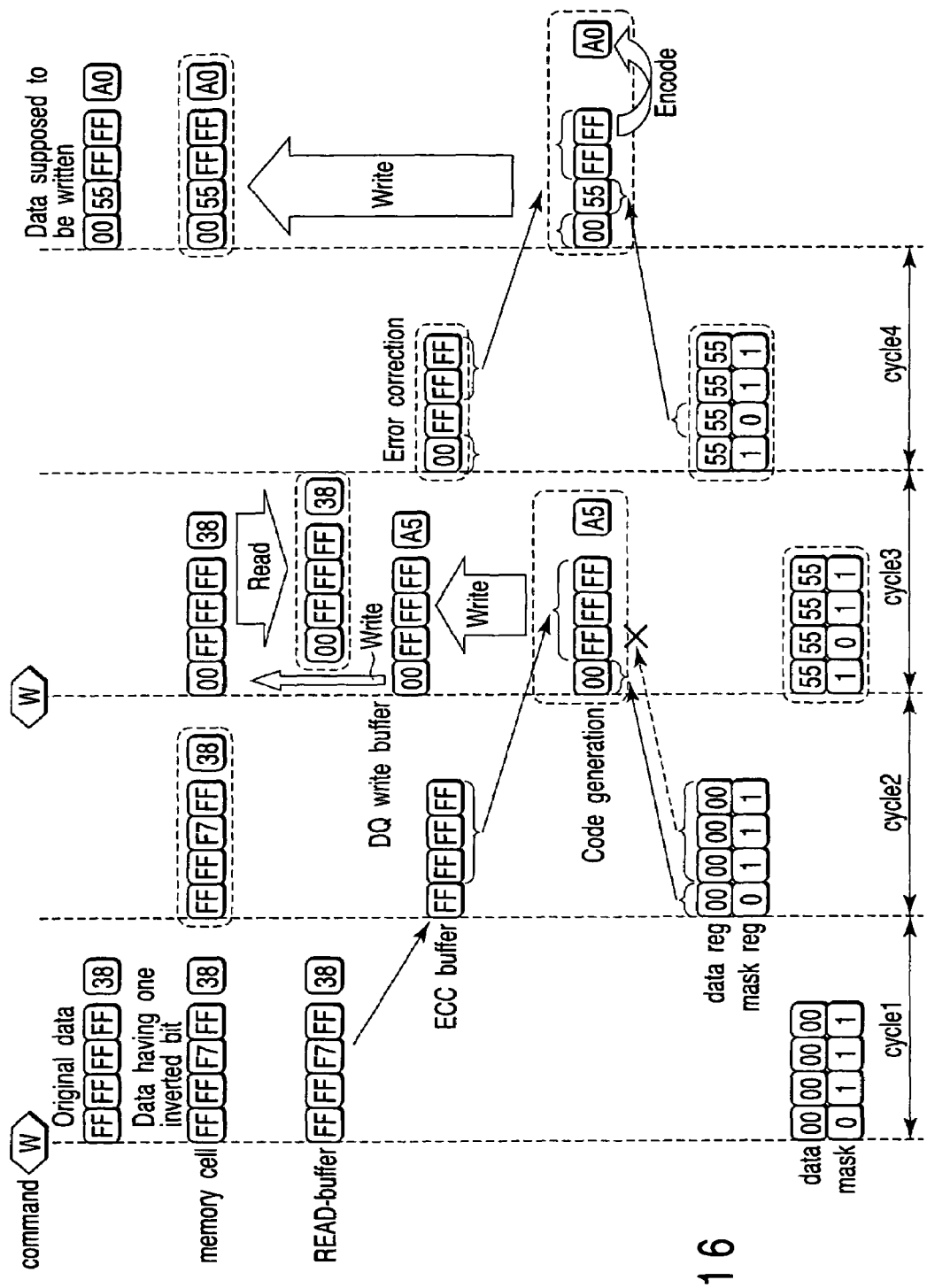
FIG. 16 is a schematic view showing the data flow of a write operation when a second write command designating the same address as a first write command is input two cycles after the first write command in the first embodiment.

FIG. 16 schematically shows the data flow of a write operation when a second write command for the same address as a first write command is input two cycles after the first write command in the first embodiment described above. In this case, a multiplexer 52 or 53 shown in FIG. 12 selects corrected data RX, and the data RX is transmitted as RZ or RY to the subsequent stage and used in encoding or data output. That is, a select signal RVtoRZ or RVtoRY of the multiplexer 52 or 53 stays low. Referring to FIG. 16, the second write command is started in cycle 3.

On the other hand, when the first write command is input, encoding and write to the memory cell are performed in cycle 3. After that, read from the memory cell is performed by the second write command for the same address. Accordingly, a read error may occur when the data written in the same column address is read out before write to the memory cell by the first write command is substantially completed.

Fourth Embodiment

No problem arises when encoding and write to a memory cell are faster than read. However, when the time required for encoding for a first write command is long, a read operation corresponding to a second write command may start before correct data is written in a bit line. In this case, no correct write and read operations can be expected. Especially when the cycle time is shortened to perform a high-speed operation, a situation like this limits the performance.

FIG. 17 is a block diagram for explaining the fourth embodiment which eliminates this limitation, in which some data paths are schematically shown. In the data paths shown in FIG. 17, a multiplexer 54 which receives an output from a DQ read buffer 32 and a code WX output from a code generator 42 is formed.

If a write command or read command for the same address as the second write command is input two cycles after the first write command when the latency is 3 as described above, the code WX to be input to a DQ write buffer 41 is selected and transferred to an RD line. This can shorten the time required for write.

Fifth Embodiment

Figure 18:
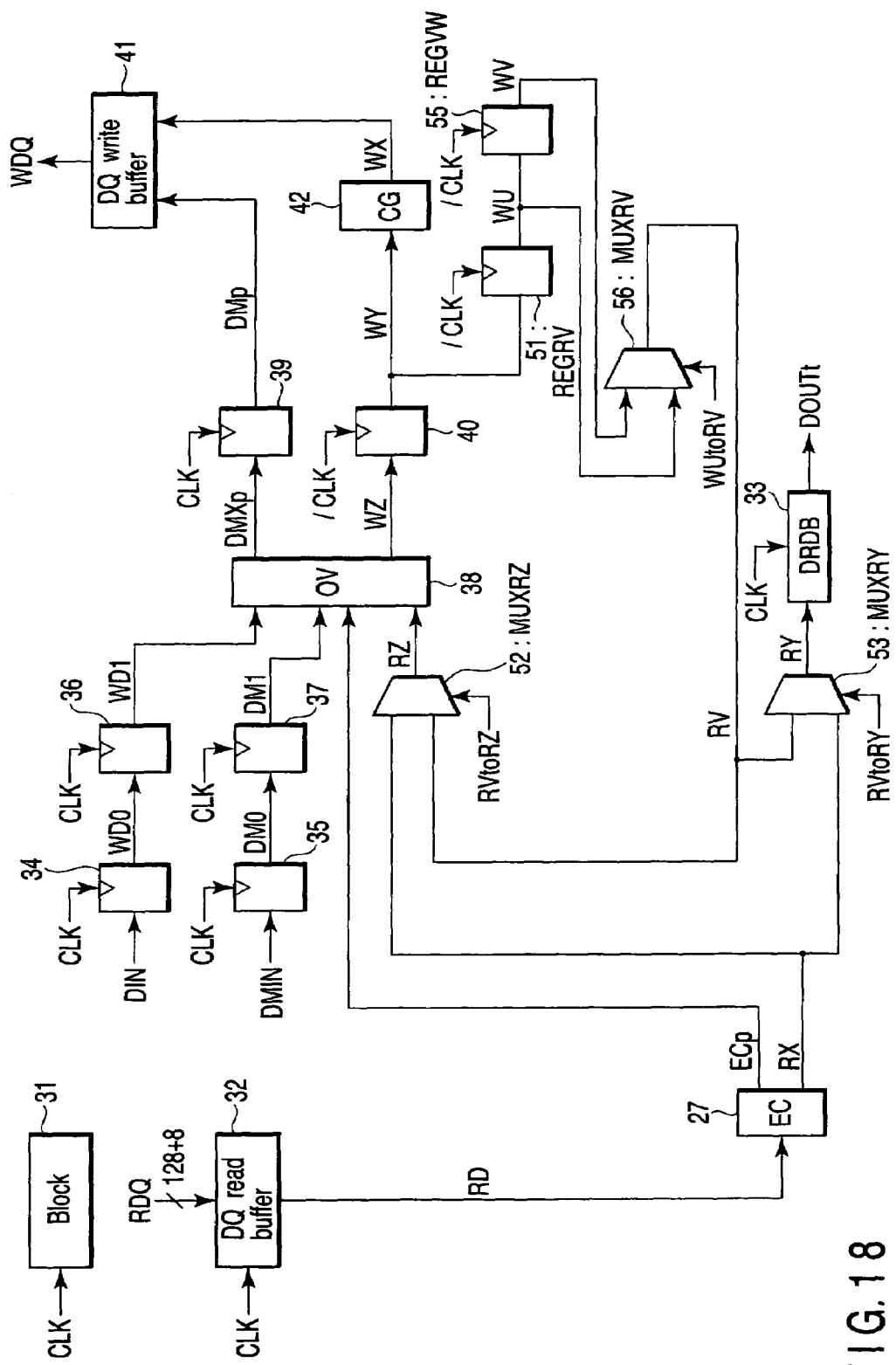
FIG. 18 is a block diagram for explaining a semiconductor memory according to the fifth embodiment of the present invention, in which some data paths are schematically shown.

FIG. 18 is a block diagram for explaining a semiconductor memory according to the fifth embodiment of the present invention, in which some data paths are schematically shown. That is, FIG. 18 shows the fifth embodiment which is a further improved embodiment. Referring to FIG. 18, a multiplexer (MUXRV) 56 and register (REGWV) 55 are added to the data paths of the first embodiment shown in FIG. 12. The register 55 receives the contents of overwritten data WU at the timing of the leading edge of a clock signal /CLK, and outputs the data to WV. The multiplexer 56 selects WU or WV in accordance with the level of a select signal WUtoRV. The multiplexer 56 transfers the contents of WU to RV when WUtoRV is high, and transfers the signal of WV to RV when WUtoRV is low.

The select signal WUtoRV goes high when a second write command having the same address as a first write command is input two cycles after the first write command.

FIGS. 19A, 19B, 20A, 20B, and 21 illustrate, in more detail, representative circuits indicated by the blocks, and circuits which generate signals for controlling these representative circuits, in the semiconductor memory according to the fifth embodiment shown in FIG. 18. These circuits are required for an operation when the latency is 3. Therefore, some corrections are necessary when the latency is not 3 or in a different pipeline configuration.

Figure 19A:
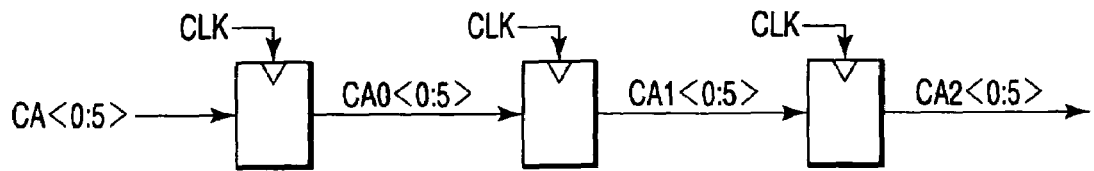
FIGS. 19A and 19B are circuit diagrams showing an address matching detection circuit.
Figure 19B:
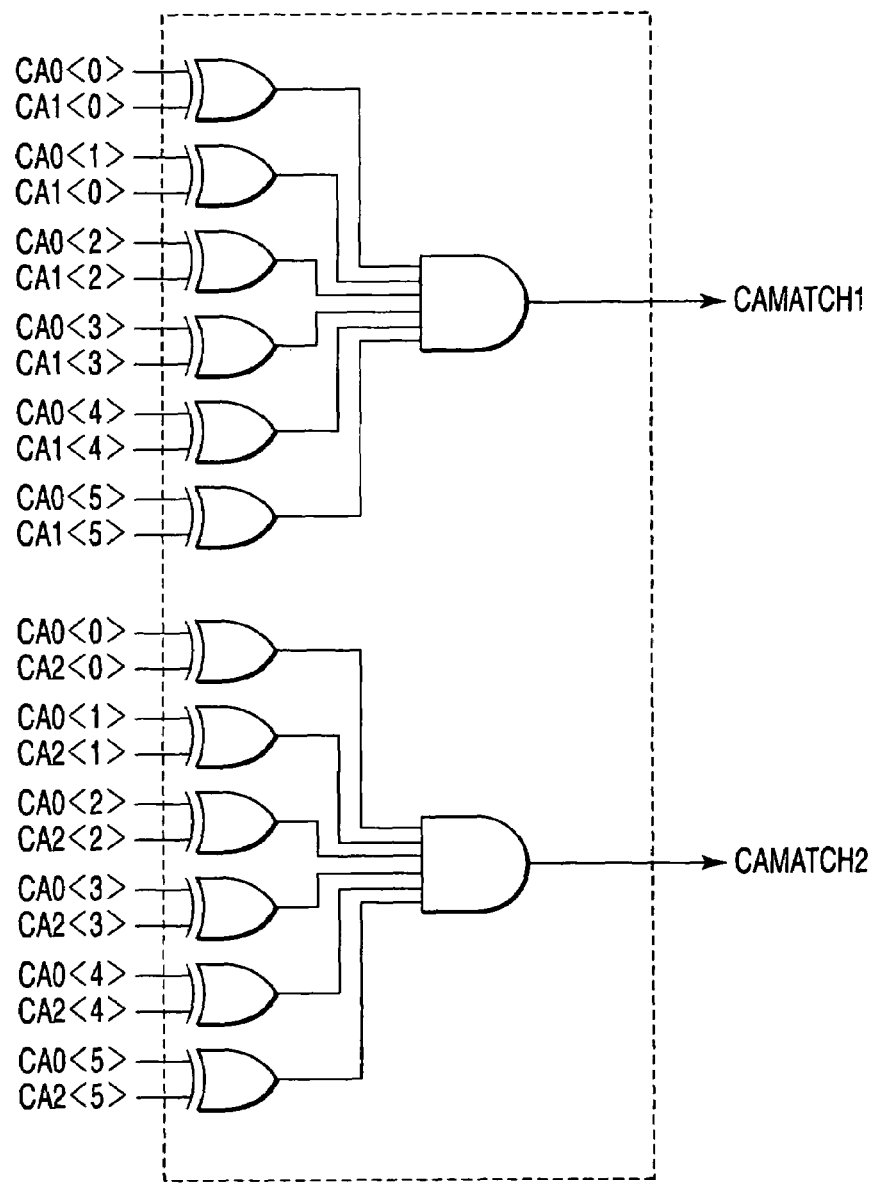

FIGS. 19A and 19B show an address matching detection circuit. FIG. 19A is a schematic block diagram, and FIG. 19B shows a practical logic configuration. This address matching detection circuit is formed in the address controller of the control block 16 in the DRAM macro shown in FIGS. 1 and 2.

Assume, for example, that a column address has six bits and is designated by CA<0:5> in a certain macro configuration. If column address CA0<0:5> in the present cycle and column address CA1<0:5> in the immediately preceding cycle are the same, a column address matching detection signal CAMATCH1 goes high. Also, when column address CA0<0:5> in the present cycle and column address CA2<0:5> in a cycle two cycles before the present cycle are the same, a column address matching detection signal CAMATCH2 goes high.

Figure 20A:
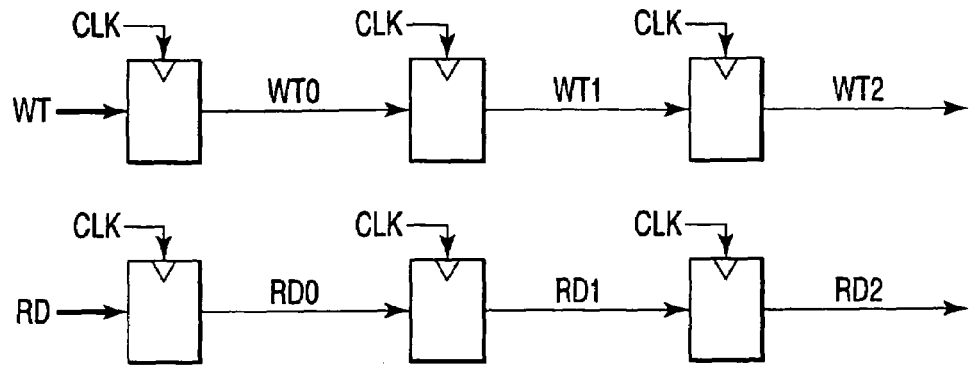
FIGS. 20A and 20B are circuit diagrams showing a command matching detection circuit.
Figure 20B:
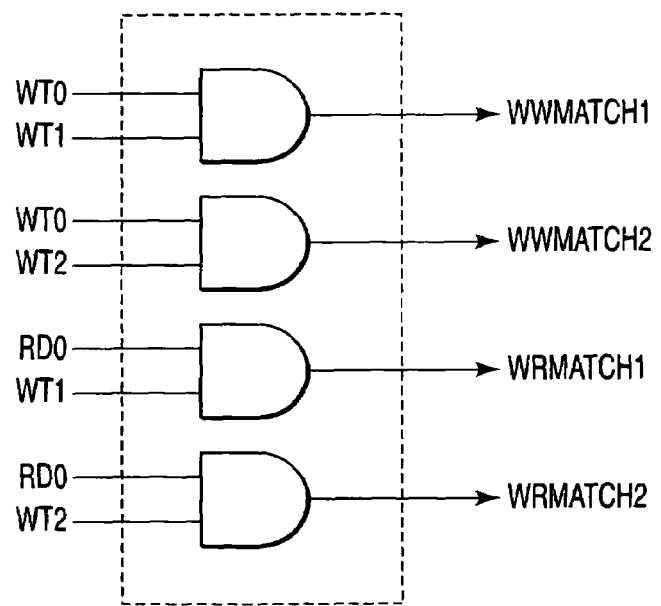

FIGS. 20A and 20B show a command matching detection circuit. FIG. 20A is a schematic block diagram, and FIG. 20B shows a practical logic configuration. This command matching detection circuit is formed in the command controller of the control block 16 in the DRAM macro shown in FIGS. 1 and 2.

For example, when a command in the present cycle is a write command which is WT0=high and a command in the immediately preceding cycle is also a write command which is WT1=high, a write command detection signal WWMATCH1 goes high. If a command in the present cycle is a write command which is WT0=high and a command in a cycle two cycles before the present cycle is also a write command which is WT2=high, a write command detection signal WWMATCH2 goes high.

Also, when a command in the present cycle is a read command which is RD0=high and a command in the immediately preceding cycle is a write command which is WT1=high, a write/read command detection signal WRMATCH1 goes high. If a command in the present cycle is a read command which is RD0=high and a command in a cycle two cycles before the present cycle is a write command which is WT2=high, a write/read command detection signal WRMATCH2 goes high.

Figure 21:
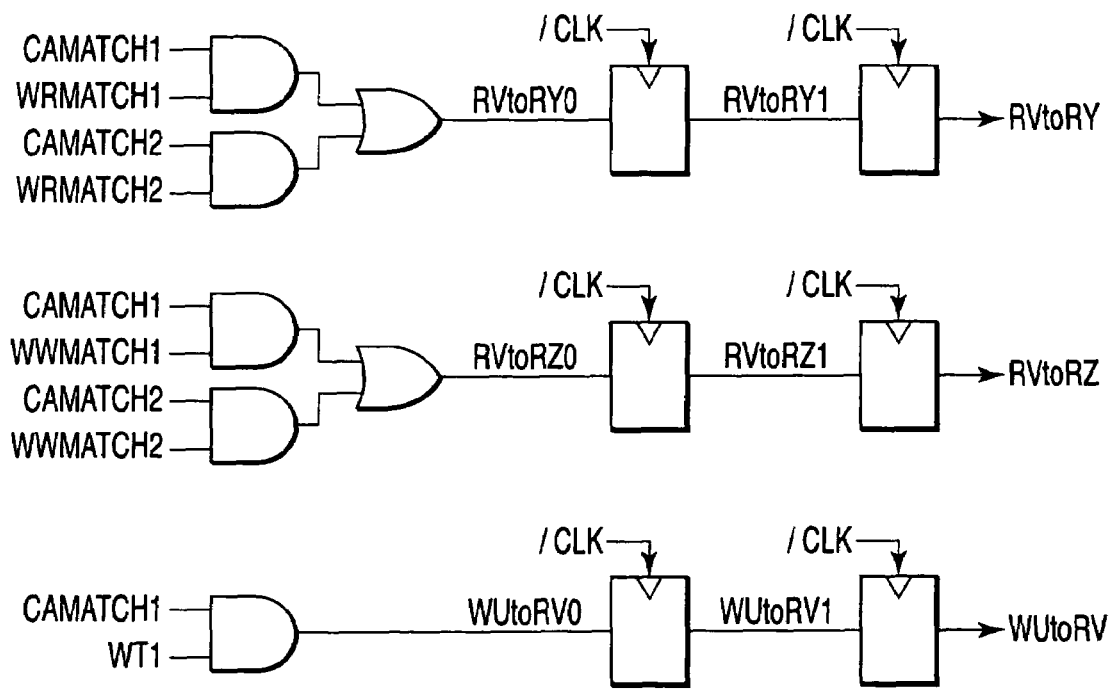
FIG. 21 is a circuit diagram showing a circuit which generates a data flow control signal.

FIG. 21 shows a circuit which generates a data flow control signal. This circuit is also formed in the command controller of the control block 16 in the DRAM macro shown in FIGS. 1 and 2. This circuit performs the following logic operations.

if (CAMATCH1=High and WRMATCH1=High) or (CAMATHC2=High and WRMATCH2=High) then RVtoRY=H after 2 clock cycles.

That is, when both the signals CAMATCH1 and WRMATCH1 are high or both the signals CAMATCH2 and WRMATCH2 are high, a signal RVtoRY goes high after two clock cycles.

if (CAMATCH1=High and WWMATCH1=High) or (CAMATHC2=High and WWMATCH2=High) then RVtoRZ=High after 2 clock cycles.

If both the signals CAMATCH1 and WWMATCH1 are high or both the signals CAMATCH2 and WWMATCH2 are high, a signal RVtoRZ goes high after two clock cycles.

if (CAMATCH1=High and WT1=High) then RUtoRV=High after 2 cycles.

If both the signals CAMATCH1 and WT1 are high, a signal RUtoRV goes high after two clock cycles.

Figure 22:
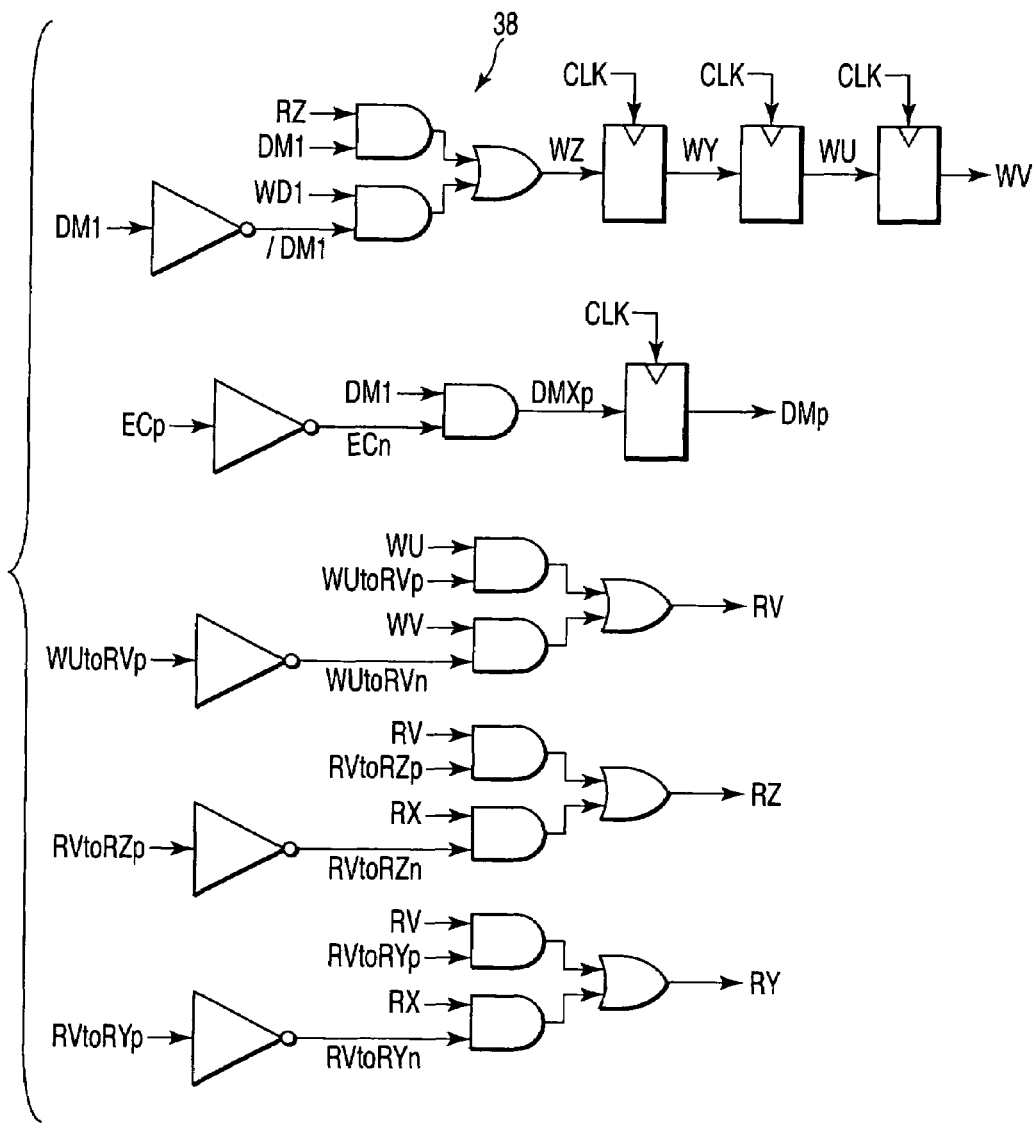
FIG. 22 is a circuit diagram showing a circuit which controls the flow of data by using the data flow control signal generated by the circuit shown in FIG. 21.

FIG. 22 shows a circuit which controls a data flow by the data flow control signal generated by the logic circuit shown in FIG. 21. This circuit is formed in the ECC I/O blocks 14 and 15 in the circuits shown in FIGS. 1 and 2. In the circuit shown in FIG. 2, for example, "128+8" circuits are formed in the ECC I/O block 15. FIG. 22 shows only main portions of the circuit shown in FIG. 18.

The sequence of overwritten data WZ→WY→WU→WV is readout corrected data RZ when the data is masked (if data mask information DM1 is high), and is the same as externally input write data WD1 when the data is not masked (if DM1 is low).

A signal DMp is corrected mask information. If error correction occurs, error position information ECp is high. In this case, the mask information DMp is low regardless of whether the data mask information of the bit is DM1=high or DM1=low. Consequently, the data is not masked regardless of the original data mask information DM1, so correct data is written in the memory cell.

Circuit portions which output select signals RV, RZ, and RY indicate the logic configurations of multiplexers MUXRV, MUXRZ, and MUXRY in the circuit shown in FIG. 18. Multiplexing is performed in accordance with select signals WUtoRVp, RVtoRZp, and RVtoRYp.

Figure 23:
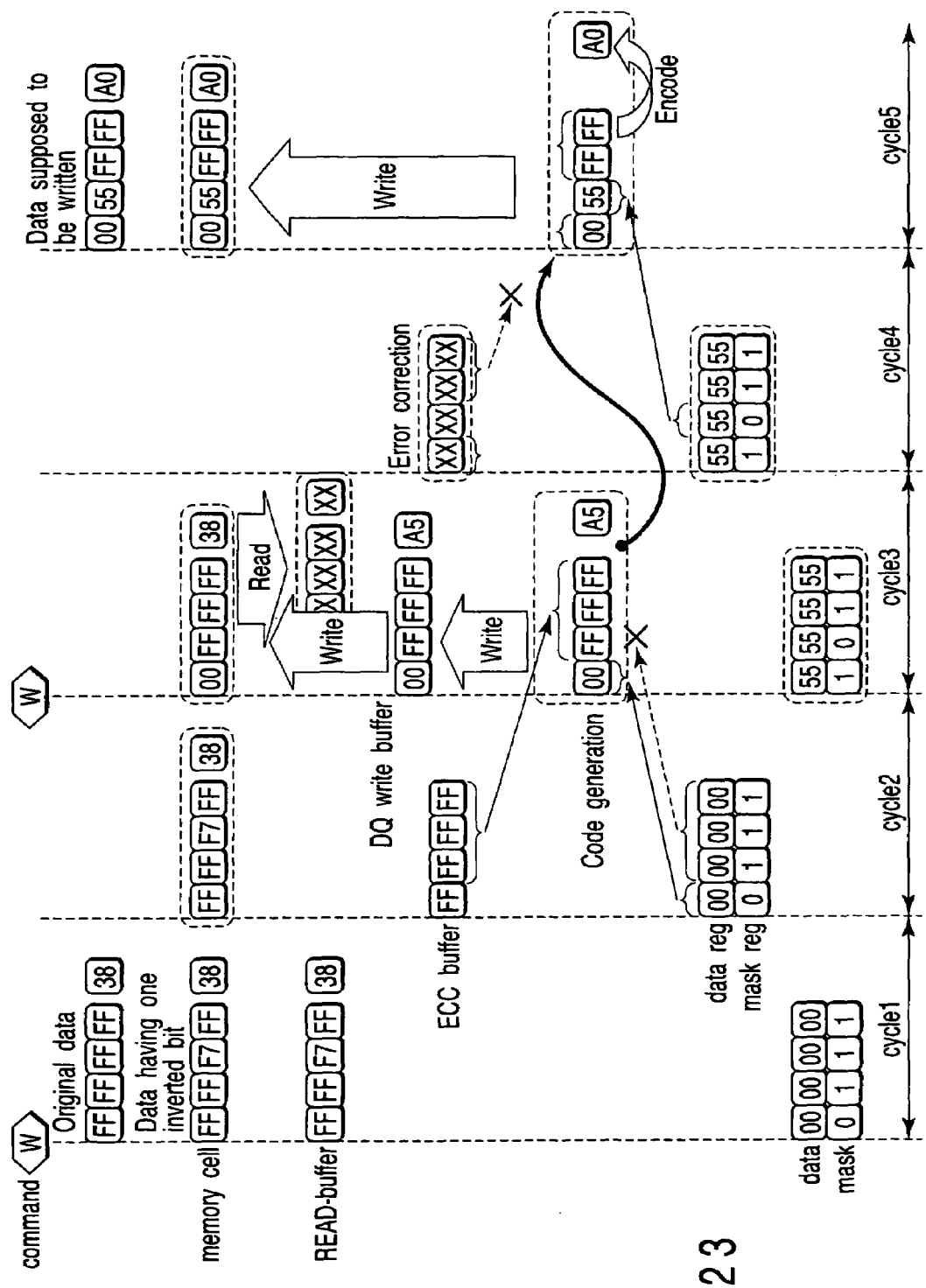
FIG. 23 is a schematic view showing a data flow in the semiconductor memory according to the fifth embodiment when a write command designating the same address as the second write command is input two cycles after the first write command.

FIG. 23 is a schematic view showing a data flow in the semiconductor memory according to the fifth embodiment shown in FIG. 18, when a write command for the same address as the second write command is input two cycles after the first write command.

In this case, as in FIG. 16, encoding corresponding to the first write command and write to a memory cell are performed in cycle 3. However, data which is read out from the memory cell in response to the second write command in cycle 3 and undergoes error correction in cycle 4 is not used in encoding in cycle 5. That is, the data used in the encoding in cycle 3 is overwritten by write data and write mask information corresponding to the second write command input in cycle 3, and used as an input to the code generation in cycle 5.

As a consequence, a correct code word is written in the memory cell in cycle 5, thereby completing the operation. Even when the second write command is a read command, the operation is substantially the same, and correct data is output outside the macro.

Sixth Embodiment

Figure 24:
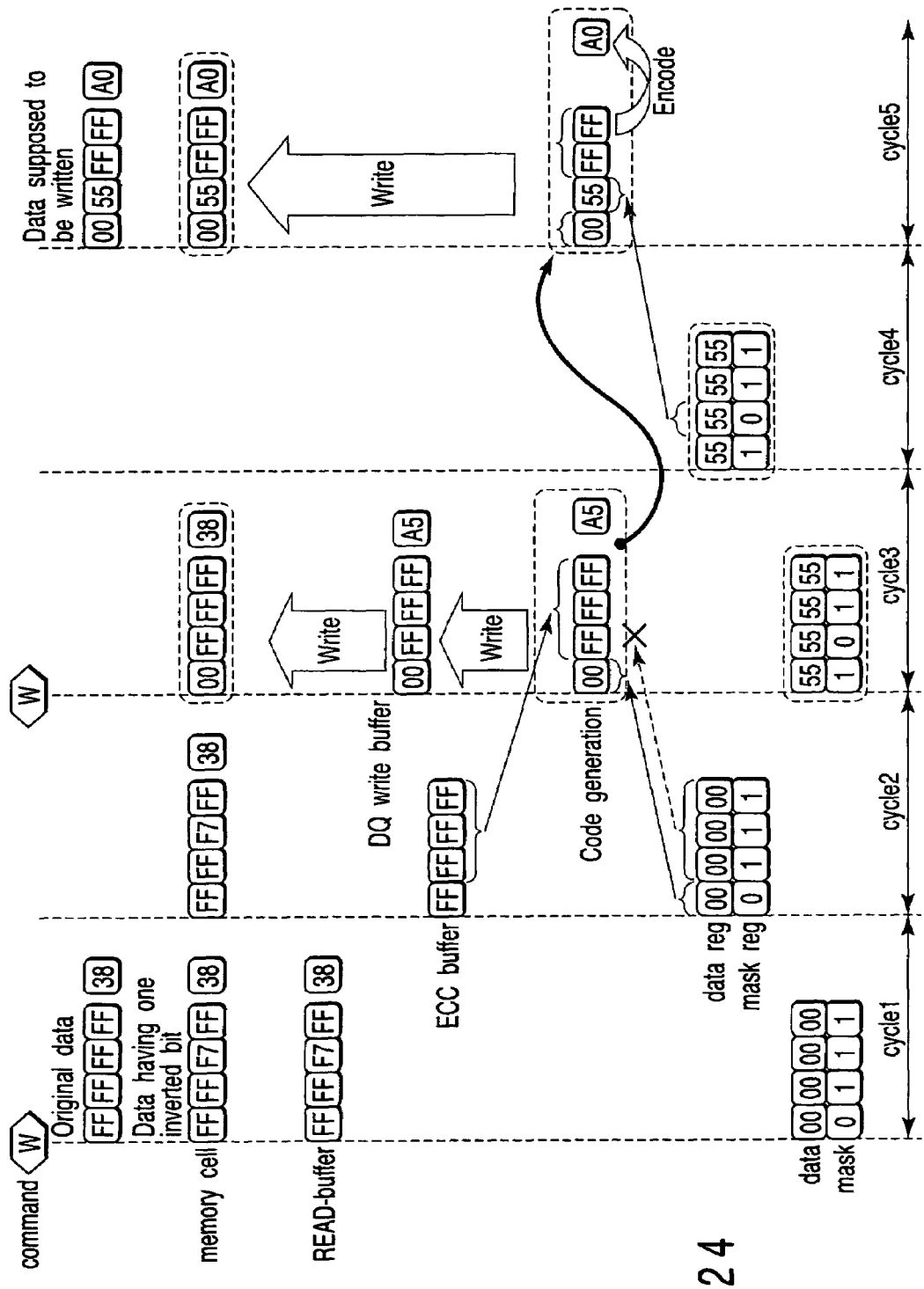
FIG. 24 is a schematic view showing the data flow of a semiconductor memory according to the sixth embodiment of the present invention.

FIG. 24 is a view schematically showing the data flow of a semiconductor memory according to the sixth embodiment of the present invention. In the sixth embodiment, read from a memory cell corresponding to a second write command in cycle 3 and an error correcting operation in cycle 4 are omitted. This data flow similarly applies to a case in which the second write command is a read command.

Seventh Embodiment

Figure 25:
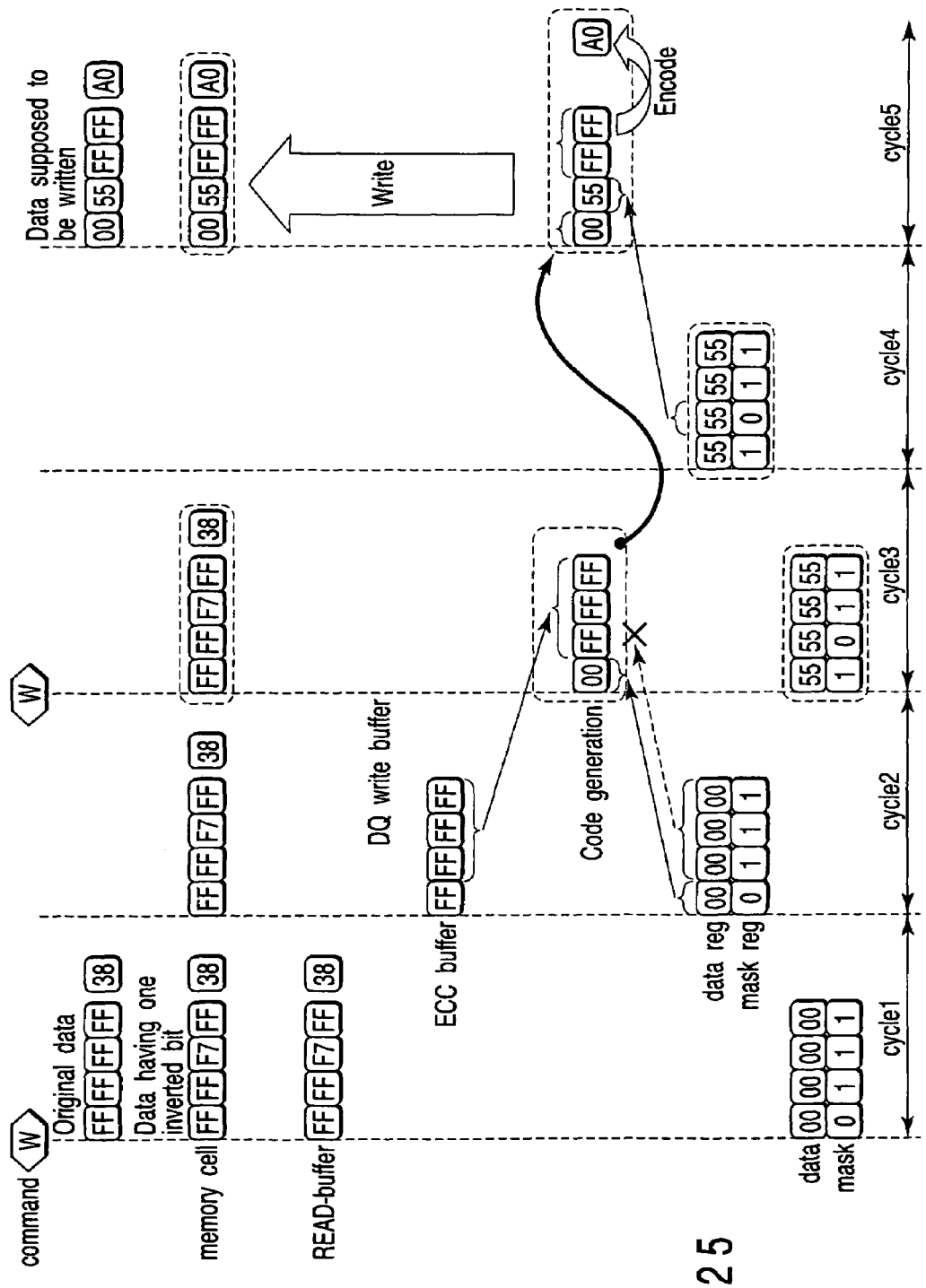
FIG. 25 is a schematic view showing the data flow of a semiconductor memory according to the seventh embodiment of the present invention.

FIG. 25 is a view schematically showing the data flow of a semiconductor memory according to the seventh embodiment of the present invention. The seventh embodiment is further improved, i.e., encoding and a write operation to a memory cell performed in cycle 3 in response to a first write command are also omitted. This is so because correct data is eventually written in the memory cell in cycle 5.

Although the present invention has been explained by the first to seventh embodiments described above, the latency is not limited to 3, and the invention is applicable to a pipeline configuration having stages other than three stages. Also, the memory having the mask write function has been explained, but the present invention is applicable to a case in which the external I/O width is substantially smaller than the internal bus width.

In a synchronous semiconductor memory which has an ECC function using an on-chip error correction circuit and performs a pipeline operation, the embodiments of the present invention can realize a high-speed operation by eliminating limitations on inputting of addresses and commands when the write mask function is used or when the external I/O width is substantially smaller than the internal bus width. In addition, since unnecessary read and write accesses to a memory cell can be stopped, a low-power-consumption, high-speed, high-reliability semiconductor memory can be implemented.

In a semiconductor memory having an error correcting function, the speed penalty can be decreased by duplexing the internal buses even when the bit width of input data is smaller than the information length of an error correcting code. In addition, when consecutive column commands such as write or read smaller in number to the latency have the same address, a high speed can be achieved by performing processing in the data paths of an ECC circuit without accessing data in a memory cell. Therefore, the power consumption can be reduced because no unnecessary write and read operations to the memory cell are performed.

According to an aspect of the present invention, therefore, it is possible to provide a semiconductor memory capable of high-speed data transfer even when the length of externally input write data is smaller than the internal bus width.

It is also possible to provide a semiconductor memory which has an error correcting function and can read out correct data and write correct data in a memory cell regardless of the order of addresses when substantially consecutive column commands are input.

Furthermore, the power consumption can be reduced by partially omitting read and write operations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A synchronous semiconductor memory which performs a pipeline operation, comprising:
    an error correction circuit configured to correct an error of data read out from a memory cell;
    a first write circuit configured to overwrite at least a portion of first write data externally input in response to a first write command on the data read out from the memory cell and corrected by the error correction circuit, and write the overwritten data in the memory cell;
    an output circuit configured to output the overwritten data outside a chip; and
    a second write circuit configured to reoverwrite at least a portion of externally input second write data on the overwritten data between a cycle in which the first write command is input and a cycle in which the overwritten data is written in the memory cell, encode the reoverwritten data, and write the encoded data in the memory cell.

2. A memory according to claim 1, further comprising a detection circuit configured to detect whether an input command and an input column address match a command and a column address input in a plurality of previous cycles, and a control signal generator configured to generate a control signal of the detection circuit.

3. A memory according to claim 2, wherein the second write circuit reoverwrites data after predetermined cycle at the overwritten data when matching the command and the column address is detected by the detection circuit.

4. A memory according to claim 2, wherein the control signal generator comprises an address controller and a command controller.

5. A memory according to claim 4, wherein the command controller comprises a first circuit which generates a data flow control signal.

6. A memory according to claim 5, wherein the control signal generator comprises a second circuit which controls a data flow by the data flow control signal generated by the first circuit.

7. A synchronous semiconductor memory which performs a pipeline operation, comprising:
    a memory cell array;
    a first sense amplifier which performs amplification for data write and read to a selected memory cell in the memory cell array;
    a data input buffer which receives data;
    a code generator which generates a code for implementing an ECC function in data write;
    a DQ buffer which receives write data encoded by the code generator, supplies the write data to the first sense amplifier, and receives read data read out from the first sense amplifier;
    a syndrome generator which receives an information bit and a code bit read out from the memory cell array, and generates a syndrome;
    an error correction circuit which performs decoding and error correction on the syndrome output from the syndrome generator; and
    a data output buffer which outputs an output signal from the error correction circuit,
    wherein at least a portion of externally input write data is overwritten on read data read out from the memory cell and corrected by the error correction circuit, and the overwritten data is written in the memory cell and output outside from the data output buffer, and
    at least a portion of write data which is externally input at a different time is reoverwritten on the overwritten data, the reoverwritten data is encoded, and the encoded data is written in the memory cell.

8. A memory according to claim 7, wherein the memory cell is a dynamic memory cell comprising a cell capacitor and a selection transistor.

9. A memory according to claim 7, further comprising a write data line driver which drives a write data line by the code output from the code generator, and supplies write data to the DQ buffer.

10. A memory according to claim 7, further comprising a read data line driver which receives data read out from the memory cell to the DQ buffer, and drives a read data line.

11. A memory according to claim 7, further comprising a second sense amplifier which sandwiches the memory cell array together with the first sense amplifier, and performs amplification for data write and read to a selected memory cell in the memory cell array.

12. A memory according to claim 11, wherein each of the first sense amplifier and the second sense amplifier comprises a dual-port sense amplifier.

13. A memory according to claim 11, wherein each of the first sense amplifier and the second sense amplifier comprises a read circuit portion and a write circuit portion.

14. A synchronous semiconductor memory which performs a pipeline operation, comprising:

an error correction circuit configured to correct an error of data read out from a memory cell;

a first write circuit configured to overwrite at least a portion of externally input first write data on the data read out from the memory cell and corrected by the error correction circuit, and write the overwritten data in the memory cell;

a second write circuit configured to reoverwrite at least a portion of externally input second write data on the overwritten data, encode the reoverwritten data, and write the encoded data in the memory cell; and a command controller configured to output a first write command to the first write circuit at a first timing synchronized with a clock signal, and, at a second timing after the first timing, output one of a second write command and a read command to a column address as an object of control by the first write command, wherein when a read operation by the second command is necessary before write to the memory cell by the first write command is completed, the overwritten data as an input to code generation by the first write command is regarded as the readout corrected data of the second command.

15. A memory according to claim 14, wherein when encoding and write to the memory cell are to be performed by regarding the overwritten data of the first write command as the readout corrected data of the second write command, encoding and write to the memory cell are not performed with respect to the first write command.

16. A memory according to claim 14, wherein when encoding and write to the memory cell are to be performed with respect to the second command or error-corrected data is to be output with respect to the second command by regarding the overwritten data of the first write command as the readout corrected data of the second write command, read from the memory cell is not performed with respect to the second command.

* * * * *